United States Patent
Senoo et al.

(10) Patent No.: US 9,064,711 B2
(45) Date of Patent: Jun. 23, 2015

(54) SEMICONDUCTOR DEVICE AND METHOD FOR FABRICATING SEMICONDUCTOR DEVICE

(75) Inventors: Masaru Senoo, Okazaki (JP); Tomoo Yamabuki, Nagoya (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 0 days.

(21) Appl. No.: 14/002,522

(22) PCT Filed: Jun. 9, 2011

(86) PCT No.: PCT/JP2011/063280
§ 371 (c)(1),
(2), (4) Date: Aug. 30, 2013

(87) PCT Pub. No.: WO2012/169053
PCT Pub. Date: Dec. 13, 2012

(65) Prior Publication Data
US 2014/0084335 A1    Mar. 27, 2014

(51) Int. Cl.
| H01L 29/43 | (2006.01) |
| H01L 21/332 | (2006.01) |
| H01L 29/06 | (2006.01) |
| H01L 29/08 | (2006.01) |
| H01L 29/32 | (2006.01) |
| H01L 29/739 | (2006.01) |
| H01L 29/861 | (2006.01) |

(Continued)

(52) U.S. Cl.
CPC ........ *H01L 29/0615* (2013.01); *H01L 29/0834* (2013.01); *H01L 29/32* (2013.01); *H01L 29/7397* (2013.01); *H01L 29/861* (2013.01); *H01L 21/221* (2013.01); *H01L 27/0664* (2013.01); *H01L 29/0684* (2013.01); *H01L 29/1095* (2013.01); *H01L 29/66348* (2013.01); *H01L 27/0761* (2013.01)

(58) Field of Classification Search
CPC ............ H01L 29/0615; H01L 29/7397; H01L 29/1095; H01L 29/0684; H01L 29/66348; H01L 27/0664
USPC .......................... 257/133, 139, 140; 438/138
See application file for complete search history.

(56) References Cited

U.S. PATENT DOCUMENTS 7,616,859 B2 * 11/2009 Tokura et al. ................. 385/147
8,729,600 B2 *  5/2014 Tsuzuki et al. ............... 257/139
(Continued)

FOREIGN PATENT DOCUMENTS

DE    102004012884 A1    10/2005
DE    102009002944 A1    12/2009
(Continued)

*Primary Examiner* — Hung Vu
(74) *Attorney, Agent, or Firm* — Oliff PLC

(57) ABSTRACT

A method for fabricating a semiconductor device in which a lifetime control region can be formed within a predetermined range with high positioning accuracy is provided. In a semiconductor device, an IGBT element region and a diode element region may be formed in one semiconductor substrate. The IGBT element region may include a second conductivity type drift layer and a first conductivity type body layer. The diode element region may include a second conductivity type drift layer and a first conductivity type anode layer. A concentration of heavy metal included in the drift layer of the diode element region may be set higher than a concentration of the heavy metal included in the drift layer of the IGBT element region.

6 Claims, 18 Drawing Sheets

(51) Int. Cl.
*H01L 21/22* (2006.01)
*H01L 27/06* (2006.01)
*H01L 29/10* (2006.01)
*H01L 29/66* (2006.01)
*H01L 27/07* (2006.01)

(56) References Cited

U.S. PATENT DOCUMENTS

| | | |
|---|---|---|
| 2005/0212075 A1 | 9/2005 | Neidig |
| 2005/0258493 A1 | 11/2005 | Aono et al. |
| 2009/0278166 A1 | 11/2009 | Soeno et al. |
| 2011/0193132 A1* | 8/2011 | Kouno et al. ............ 257/139 |

FOREIGN PATENT DOCUMENTS

| | | |
|---|---|---|
| JP | A-61-133659 | 6/1986 |
| JP | A-63-76456 | 4/1988 |
| JP | A-04-125933 | 4/1992 |
| JP | A-2003-224129 | 8/2003 |
| JP | A-2005-317751 | 11/2005 |
| JP | A-2007-317883 | 12/2007 |
| JP | A-2008-192737 | 8/2008 |
| JP | A-2009-272550 | 11/2009 |
| JP | A-2010-263149 | 11/2010 |

* cited by examiner

SEMICONDUCTOR DEVICE AND METHOD FOR FABRICATING SEMICONDUCTOR DEVICE

TECHNICAL FIELD

The present application relates to a reverse-conducting semiconductor device comprising an IGBT element region and a diode element region that are formed in one semiconductor substrate.

BACKGROUND ART

Japanese Patent Application Publication No. 2008-192737 discloses a semiconductor device comprising an IGBT (insulated gate bipolar transistor) and a FWD (free wheel diode) that are formed in one semiconductor substrate. With the semiconductor device, by selectively performing ion irradiation on an FWD region, defect regions having more crystal defects than other regions are formed exclusively in the FWD region. A defect region functions as a region capable of controlling a carrier lifetime (a lifetime control region).

SUMMARY OF INVENTION

Technical Problem

With the introduction of crystal defects by ion irradiation, due to the difficulty of controlling a range and a distribution of irradiated ions, it is difficult to control a distribution of crystal defects with high accuracy. For example, methods of selectively performing ion irradiation on an FWD region include a method in which an irradiation mask, having an opening formed in advance in a portion corresponding to the FWD region, is formed on a wafer surface and ion irradiation is performed via the irradiation mask. However, although forming the irradiation mask on the wafer surface requires aligning the wafer and the irradiation mask with each other, it is difficult to perform the alignment with high accuracy. Inadvertent formation of defect regions in an IGBT region due to an inability to increase the accuracy of controlling crystal defect distribution causes an increase in resistance of the IGBT. In addition, a failure to form the defect regions in the FWD region results in increasing a reverse recovered charge of the diode.

The technique disclosed in the present application has been devised in order to solve the problems described above. That is, the present application provides a technique which enables position control of a lifetime control region with higher accuracy in a semiconductor device comprising an IGBT element region and a diode element region that are formed in one semiconductor substrate.

Solution to the Technical Problem

The semiconductor device disclosed in the present application may be a semiconductor device comprising an IGBT element region and a diode element region that are formed in one semiconductor substrate. The IGBT element region may comprise a second conductivity type drift layer and a first conductivity type body layer. The diode element region may comprise a second conductivity type drift layer and a first conductivity type anode layer. A concentration of heavy metal included in the drift layer of the diode element region may be higher than a concentration of heavy metal included in the drift layer of the IGBT element region.

With the semiconductor device according to the present application, the concentration of heavy metal included in the drift layer of the diode element region is higher than the concentration of heavy metal included in the drift layer of the IGBT element region. The heavy metal included in the drift layer has an effect of reducing a carrier lifetime. Accordingly, a lifetime control region that controls the carrier lifetime can be formed in the diode element region. In addition, a distribution of heavy metal can be controlled exclusively by temperature and a physical constant. Therefore, compared to a case where crystal defects are introduced by irradiation, distribution control of a lifetime killer can be performed with higher accuracy.

In addition, in the semiconductor device according to the present application, a first conductivity type collector layer, a second conductivity type drift layer, and a first conductivity type body layer may be sequentially laminated in the IGBT element region. A first trench electrode that penetrates the body layer from a surface of the body layer, projects into the drift layer and is surrounded by an insulating film may be formed. A second conductivity type emitter region may be formed at a particular area that makes contact with the first trench electrode via the insulating film and may be exposed at a surface of the semiconductor substrate, and the emitter region may be separated from the drift layer by the body layer. A second conductivity type cathode layer, a second conductivity type drift layer, and a first conductivity type anode layer may be sequentially laminated in the diode element region. A second trench electrode that penetrates the anode layer from a surface of the anode layer, projects into the drift layer and is surrounded by an insulating film may be formed. When the surface of the body layer on which an opening portion of the first trench electrode is formed and the surface of the anode layer on which an opening portion of the second trench electrode is formed are observed, a total length, per unit area of the diode element region, of a borderline configuring the opening portion of the second trench electrode may be longer than a total length, per unit area of the IGBT element region, of a borderline configuring the opening portion of the first trench electrode.

When the semiconductor device is heated, stress is generated on an entire trench and minute crystal defects are formed in a semiconductor region surrounding the trench. In this case, the stress is generated with a boundary surface between the trench and the semiconductor region as its starting point. In the semiconductor device according to the present application, the total length, per unit area of the diode element region, of the borderline configuring the opening portion of the second trench electrode is longer than the total length, per unit area of the IGBT element region, of the borderline configuring the opening portion of the first trench electrode. Therefore, since a concentration of the boundary surface between the trench and the semiconductor region is higher in the diode element region than in the IGBT element region, crystal defects are generated at a higher concentration. In other words, the number of crystal defects in the drift layer disposed within the diode element region exceeds the number of crystal defects in the drift layer disposed within the IGBT element region. Furthermore, crystal defects getter (trap and anchor) heavy metal. Therefore, the diode element region is able to getter heavy metal at a higher concentration than the IGBT element region. Accordingly, since the diode element region is able to reduce the carrier lifetime to a greater degree than the IGBT element region, recovery loss in the diode element region can be reduced.

In addition, the semiconductor device disclosed in the present application may further comprise an electrode including the heavy metal, and the electrode may make contact with at least a portion of a semiconductor layer disposed within the diode element region. By having the electrode including the heavy metal make contact with the semiconductor layer disposed within the diode element region, heavy metal can be introduced into the semiconductor layer. According to this method, since there is no longer a need to perform processes such as the ion irradiation compared to the case where the lifetime control region is formed by introducing crystal defects with the ion irradiation, the process of forming the lifetime control region can be simplified.

Furthermore, in the semiconductor device disclosed in the present application, a first distance between a contacting region and the emitter region disposed within the IGBT element region may be equal to or more than a diffusion distance of the heavy metal included in the electrode, the contacting region being a region at which the electrode including the heavy metal and the semiconductor layer disposed within the diode element region make contact. The heavy metal diffuses in an approximately concentric pattern with a contacting region of the electrode and the semiconductor layer as a starting point. In addition, a diffusion distance of heavy metal is determined by temperature and a physical constant. With the semiconductor device disclosed in the present application, since the first distance between the contacting region and the emitter region disposed within the IGBT element region is equal to or more than the diffusion distance, the heavy metal can be prevented from diffusing to the emitter region. Therefore, a situation in which an on-resistance of the IGBT increases due to a presence of heavy metal in a vicinity of the emitter region can be prevented.

In addition, in the semiconductor device disclosed in the present application, the first distance may be equal to or greater than a second distance, the second distance being a distance determined by a sum of a thickness of the cathode layer of the diode element region and a thickness of the drift layer of the diode element region. Accordingly, since the diffusion of heavy metal to the emitter region can be reliably prevented, a situation where the on-resistance of the IGBT increases can be prevented.

Furthermore, in the semiconductor device disclosed in the present application, the semiconductor layer disposed within the diode element region and the electrode including the heavy metal may make contact via an interlayer that has a property of diffusing heavy metal, and a thickness of the interlayer may be less than a diffusion distance of the heavy metal included in the electrode. Examples of the interlayer include a silicon oxide film. Accordingly, even if the interlayer exists, the heavy metal is able to pass through the interlayer due to a heat process after electrode formation. As a result, sufficient diffusion of the heavy metal in the semiconductor layer can be achieved.

In addition, a method for fabricating a semiconductor device disclosed in the present application is a method for fabricating a semiconductor device that comprises an IGBT element region and a diode element region in one semiconductor substrate. The method may comprise a contacting process of causing a wafer to make contact with a wafer holding table including heavy metal, and a heating process of heating the wafer after the contacting process. Accordingly, by having the wafer holding table and a back surface of the wafer make contact with each other, heavy metal can be introduced into the semiconductor layer. With this fabrication method, since there is no longer a need to perform processes such as the ion irradiation compared to the case where the lifetime control region is formed by introducing crystal defects with the ion irradiation, the process of forming the lifetime control region can be simplified.

Furthermore, the method for fabricating a semiconductor device disclosed in the present application may further comprise a first forming process of forming a first trench electrode in the IGBT element region and a second forming process of forming a second trench electrode in the diode element region. When the surface of the wafer to which the first forming process and the second forming process have been performed is observed, a total length, per unit area of the diode element region, of a borderline configuring an opening portion of the second trench electrode may be longer than a total length, per unit area of the IGBT element region, of a borderline configuring an opening portion of the first trench electrode. The first forming process and the second forming process may be performed prior to the heating process. Due to the heating process, heavy metal introduced from the back surface of the wafer is diffused in the semiconductor layer. In addition, since a concentration of the boundary surface between the trench and the semiconductor region is higher in the diode element region than in the IGBT element region, crystal defects are generated at a higher concentration. Therefore, the diode element region is able to getter heavy metal at a higher concentration than the IGBT element region. Accordingly, since the diode element region is able to reduce the carrier lifetime to a greater degree than the IGBT element region, recovery loss in the diode element region can be reduced.

In addition, the method for fabricating a semiconductor device disclosed in the present application may further comprise a polishing process of polishing a back surface of the wafer. The polishing process may be performed prior to the contacting process. By performing the polishing process prior to the contacting process, even when a gettering layer or the like for capturing impurities has been formed on the back surface of the wafer, heavy metal can be introduced in a state where the gettering layer is removed by polishing. As a result, sufficient diffusion of the heavy metal in the semiconductor layer can be achieved.

Effect of the Invention

According to the method for fabricating a semiconductor device disclosed in the present application, the lifetime control region can be formed with high positioning accuracy by the method for fabricating a semiconductor device comprising a lifetime control region in a predetermined range.

BRIEF DESCRIPTION OF DRAWINGS

FIG. 3 is a partial sectional view of a semiconductor device 1a;

DETAILED DESCRIPTION OF INVENTION

Some of features of the embodiments described below will now be listed.

(Feature 1) An electrode including heavy metal is in contact with a portion of an anode layer disposed within a diode element region.

(Feature 2) An electrode including heavy metal is in contact with a portion of a cathode layer disposed within a diode element region.

(Feature 3) A depth of a second trench electrode is set deeper than a depth of a first trench electrode.

(Feature 4) An IGBT element region comprises a planar electrode.

(Feature 5) A wafer holding table is a transport stage.

(Feature 6) Gold, platinum, silver, copper, chromium, cadmium, mercury, zinc, arsenic, manganese, cobalt, nickel, molybdenum, tungsten, or the like is used as the heavy metal.

First Embodiment

Figure 1:
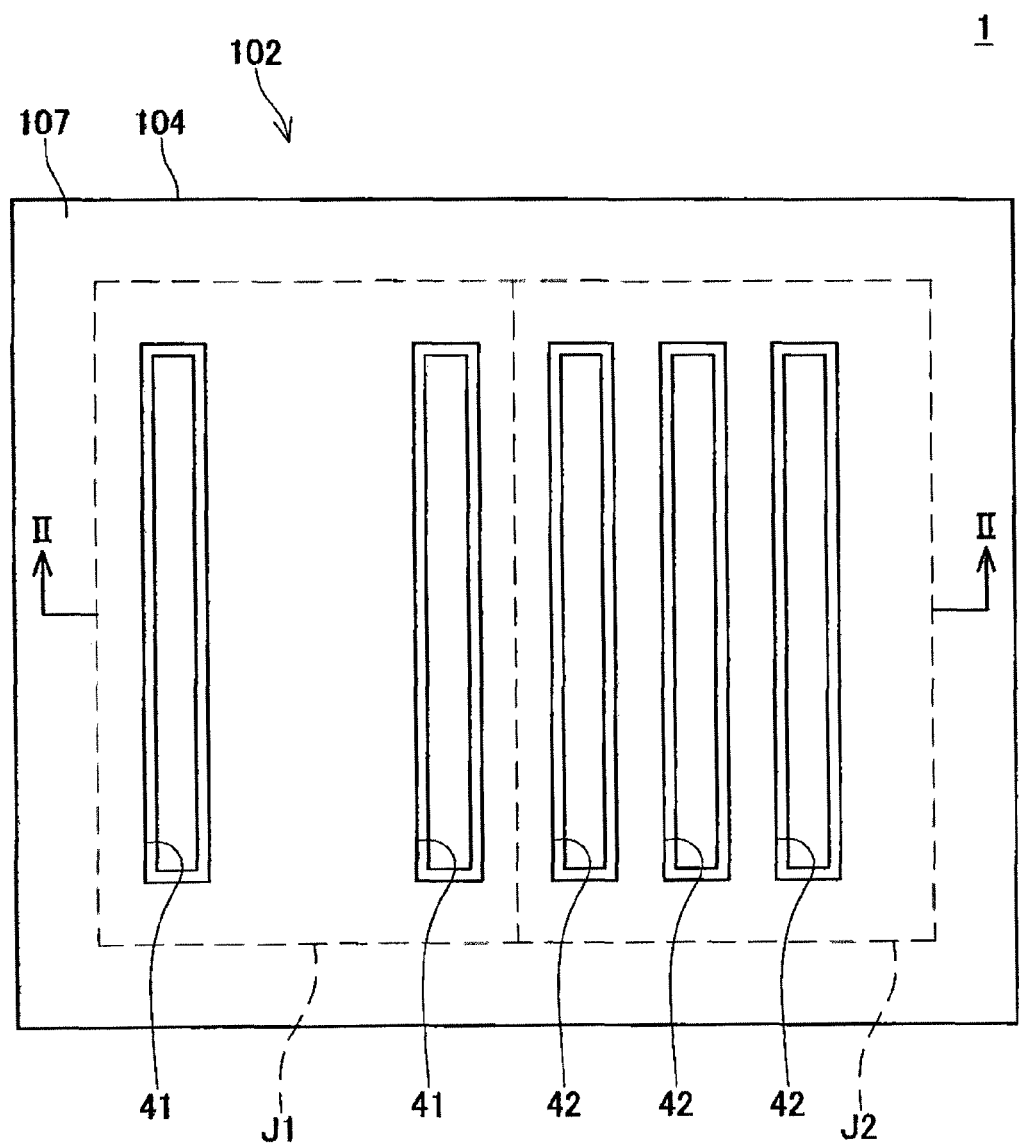
FIG. 1 is a plan view of a semiconductor device 1.

FIG. 1 is a plan view of a semiconductor device 1 according to a first embodiment. The semiconductor device 1 is a reverse-conducting semiconductor device comprising an IGBT and a diode that are formed in one semiconductor substrate. In FIG. 1, for viewability, an insulating film and an electrode on a trench are not depicted. As shown in FIG. 1, the semiconductor device 1 is fabricated using a semiconductor substrate 102 having an outer periphery 104. The semiconductor substrate 102 is divided into a cell area in which an IGBT element region J1 and a diode element region J2 are fabricated, and a terminal area 107 which surrounds the cell area.

Definitions of the cell area and the terminal area 107 will now be provided. The cell area is a region in which electrodes for driving the IGBT element region J1 and the diode element region J2 are formed on a surface of the semiconductor substrate 102. Examples of such electrodes include a first electrode 5 and a second electrode 6 (refer to FIG. 2). On the other hand, the terminal area 107 is a region in which electrodes for driving the IGBT element region J1 and the diode element region J2 are not formed. In the semiconductor device 1 shown in FIG. 1, an electrode (not shown) is formed in a region enclosed by a dotted line (the IGBT element region J1 and the diode element region J2). On the other hand, an electrode is not formed outside the region enclosed by the dotted line (the terminal area 107). Moreover, there are cases where regions in which a floating electrode is formed exist on the surface of the semiconductor substrate 102. Since such regions are not electrodes for driving the IGBT element region J1 and the diode element region J2, the regions do not correspond to cell areas. In addition, although there are cases where a trench is formed at a boundary between the cell area and the terminal area 107 or where regions are formed with an impurity concentration set higher than other regions, such regions similarly do not correspond to cell areas.

Two first trenches 41 are formed in the IGBT element region J1 so as to extend upward and downward in FIG. 1. In addition, three second trenches 42 are formed in the diode element region J2 so as to extend upward and downward in FIG. 1. As shown in FIG. 1, opening portions of the first trenches 41 and the second trenches 42 have rectangular closed-loop shapes.

A total length, per unit area of the IGBT element region J1, of borderline(s) configuring the opening portion(s) of the first trench(es) 41 is herein defined as a length L1. A total length, per unit area of the diode element region J2, of borderline(s) configuring the opening portion(s) of the second trench(es) 42 is herein defined as a length L2. As shown in FIG. 1, an area of the IGBT element region J1 and an area of the diode element region J2 are set approximately the same. In addition, two first trenches 41 exist in the IGBT element region J1, and three second trenches 42 exist in the diode element region J2. Furthermore, as shown in FIG. 1, an area of the opening portion of the first trenches 41 and an area of the opening portion of the second trenches 42 are set approximately the same. Therefore, the length L2 is longer than the length L1. In other words, trenches are formed at a higher concentration in the diode element region J2 than in the IGBT element region J1.

The numbers of the IGBT element regions J1 and the diode element regions J2 included in the cell area are not limited to those in the example described in the present embodiment and can be set to any numbers. In addition, the number of the first trenches 41 included in the IGBT element region J1 and the number of the second trenches 42 included in the diode element region J2 are not limited to those in the example described in the present embodiment and can be set to any number.

Figure 2:
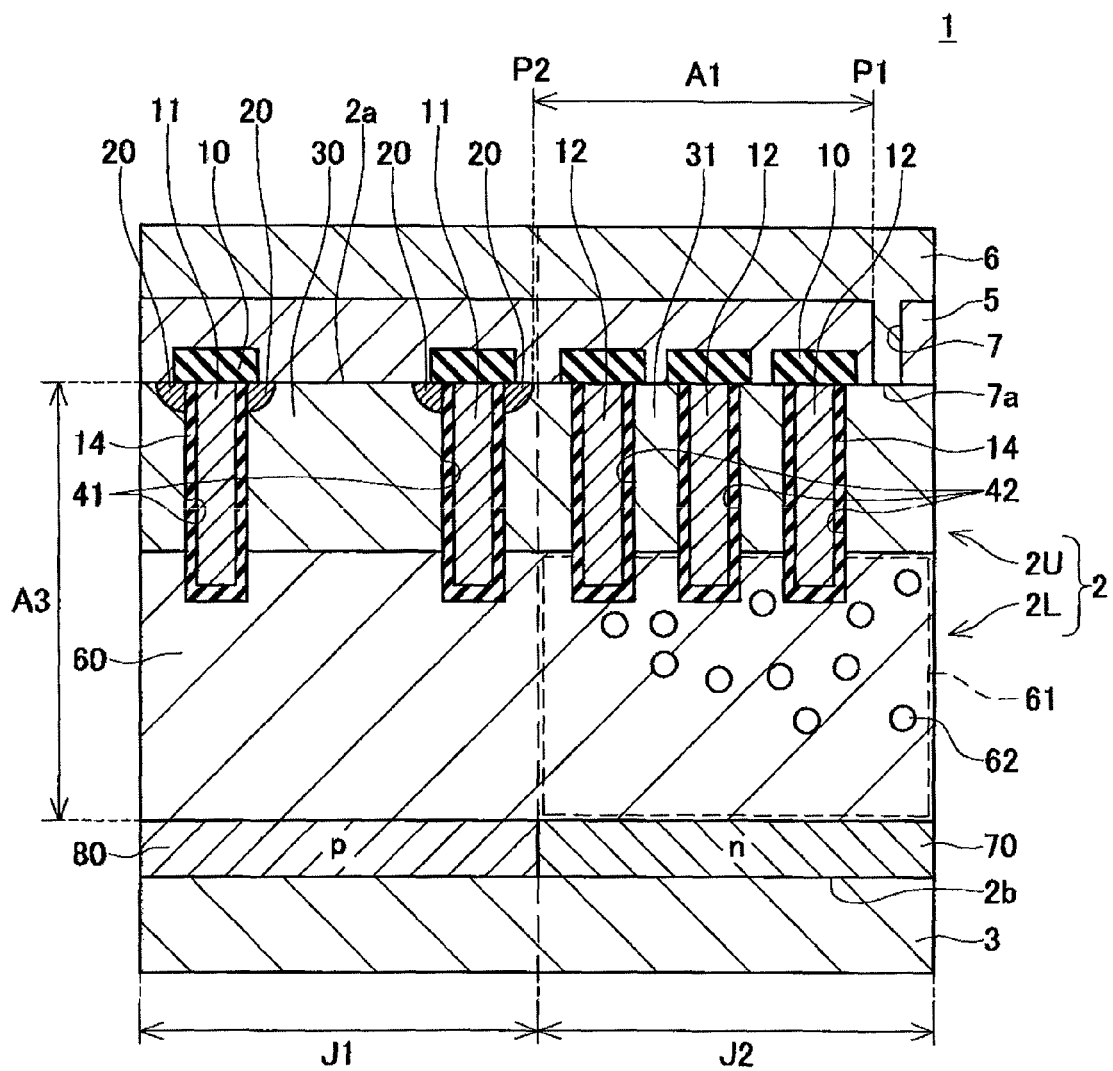
FIG. 2 is a partial sectional view of the semiconductor device 1.

FIG. 2 is a partial sectional view taken along line II-II in FIG. 1. The semiconductor device 1 comprises a semiconductor layer 2 made of silicon, a back surface electrode 3 formed on a back surface 2b of the semiconductor layer 2, a first electrode 5, and a second electrode 6. The first electrode 5 is formed on a surface 2a of the semiconductor layer 2. In addition, a trench 7 is formed on the first electrode 5. The second electrode 6 is formed on a surface of the first electrode 5 and inside the trench 7. Therefore, the second electrode 6 is in contact with a portion of a shallow portion 2U in the diode element region J2 via a contact surface 7a. The first electrode 5 is an electrode that does not include heavy metal. The second electrode 6 is an electrode that includes heavy metal. Heavy metal is a metallic element with a specific gravity of 4 to 5 or higher, such as Ni. In addition, examples of the material of the first electrode 5 include Al.

The back surface electrode 3 continuously extends over a back surface of the IGBT element region J1 and a back surface of the diode element region J2. The semiconductor layer 2 comprises the shallow portion 2U and a deep portion 2L. The deep portion 2L comprises a p type collector region 80 and an n type cathode region 70. The collector region 80 is formed in a range of the IGBT element region J1 among the back surface 2b of the semiconductor layer 2. The cathode region 70 is formed in a range of the diode element region J2 among the back surface 2b. The back surface electrode 3 described above is commonly connected to the collector region 80 and the cathode region 70. In addition, the deep portion 2L comprises an n⁻ type drift layer 60, and the drift layer 60 is commonly formed above the collector region 80 and the cathode region 70.

Heavy metal 62 is included in the drift layer 60. The heavy metal 62 is depicted as white circles in FIG. 2. In the semiconductor device 1, a concentration of heavy metal included in the drift layer 60 of the diode element region J2 is set higher than a concentration of heavy metal included in the drift layer 60 of the IGBT element region J1. Accordingly, a low lifetime region 61 is formed in at least a portion of the regions of the drift layer 60 of the diode element region J2. In addition, the low lifetime region 61 extends between adjacent second trenches 42. The low lifetime region 61 is a region that includes the heavy metal 62 in a higher concentration compared to other regions of the drift layer 60. In addition, the heavy metal 62 has an effect of reducing a carrier lifetime. Therefore, a hole lifetime in the low lifetime region 61 is shorter than a hole lifetime in the drift layer 60 disposed within the IGBT element region 31 at a same depth as the low lifetime region 61. Moreover, the heavy metal 62 need not necessarily be evenly distributed within the drift layer 60, and the effect as the low lifetime region 61 is produced even in a case where the heavy metal 62 is unevenly distributed.

In addition, there may be cases where heavy metal is also included in the IGBT element region J1. However, as described above, since the concentration of heavy metal included in the drift layer 60 of the diode element region J2 is set higher than the concentration of heavy metal included in the drift layer 60 of the IGBT element region J1, the heavy metal in the IGBT element region J1 can be ignored. Therefore, in subsequent drawings, the depiction (white circles) of heavy metal in the IGBT element region J1 will be omitted.

Pluralities of first trenches 41 and second trenches 42 are formed in the semiconductor layer 2. The respective first trenches 41 and second trenches 42 extend with longitudinal directions thereof aligned in a depth direction shown in FIG. 2. In addition, each trench extends from the surface 2a of the semiconductor layer 2 in a depth direction of the semiconductor layer 2. A first trench electrode 11 is housed enclosed by an insulating film 14 within each first trench 41. A second trench electrode 12 is housed enclosed by the insulating film 14 within each second trench 42. The shallow portion 2U in the IGBT element region J1 is partitioned into a plurality of p type body layers 30 by the first trenches 41. The shallow portion 2U in the diode element region J2 is partitioned into a plurality of p type anode layers 31 by the second trenches 42.

The body layers 30 disposed within the IGBT element region J1 comprise n⁺ type emitter regions 20. The emitter regions 20 are exposed at a portion of the surface 2a of the semiconductor layer 2 and are in contact with the first trenches 41. Therefore, each emitter region 20 opposes the first trench electrode 11 via the insulating film 14. In addition, the emitter regions 20 are separated from the drift layer 60 by the body layers 30. The anode layers 31 disposed within the diode element region J2 are exposed at portions of the surface 2a of the semiconductor layer 2 and are in contact with the second trenches 42.

The first electrode 5 formed on the surface 2a of the semiconductor layer 2 continuously extends over the surface of the IGBT element region J1 and the surface of the diode element region J2. In the IGBT element region J1, the first electrode 5 is electrically continuous with the emitter region 20 and the body layer 30. In addition, in the diode element region J2, the first electrode 5 is electrically continuous with the anode layers 31. An insulating film 10 is formed between each first trench electrode 11 and the first electrode 5, between each second trench electrode 12 and the first electrode 5; and the first trench electrodes 11 and the first electrode 5 or the second trench electrodes 12 and the first electrode 5 are not electrically connected to each other. The first trench electrodes 11 and the second trench electrodes 12 are connected to a gate wiring (not shown) in a region in which the first electrode 5 is not formed (any of cross sections in a depth direction in FIG. 1).

Accordingly, the semiconductor device 1 that functions as a reverse-conducting IGBT is constructed. The semiconductor device 1 functions as a circuit in which a diode constituted by the diode element region J2 is connected inverse-parallel between a pair of main electrodes (between a collector and an emitter) of an IGBT constituted by the IGBT element region J1. The semiconductor device 1 is used to drive an electric load as typified by a motor.

Crystal defects will now be described. A fabricating process of the semiconductor device 1 includes a heating process. During the heating process, at the first trenches 41 and the second trenches 42, thermal stress is generated on the entirety of each trench due to a difference in coefficients of thermal expansion between an interior material of the trench and an exterior material of the trench. As a result, minute crystal defects are formed in a semiconductor region surrounding each trench.

In addition, in the semiconductor device 1, the length L2 (a total length, per unit area of the diode element region J2, of the borderlines configuring the opening portions of the second trenches 42) is set longer than the length L1 (a total length, per unit area of the IGBT element region J1, of the borderlines configuring the opening portions of the first trenches 41). Furthermore, since the thermal stress described above is generated with a boundary surface between the trench and the semiconductor region as a starting point, the thermal stress is generated over a wider region when the total length of the borderlines configuring the opening portions is longer. Therefore, crystal defects are generated at a higher concentration in the diode element region J2 than in the IGBT element region J1. In other words, the number of crystal defects in the drift layer 60 disposed within the diode element region J2 can be set larger than the number of crystal defects in the drift layer 60 disposed within the IGBT element region J1.

Introduction of the heavy metal 62 will now be described. The second electrode 6 is in contact with a portion of the shallow portion 2U in the diode element region J2 via the contact surface 7a. Accordingly, the heavy metal 62 can be introduced via the contact surface 7a into the drift layer 60 disposed within the diode element region J2. In addition, the crystal defects have a property of gettering (trapping and anchoring) the heavy metal 62. Moreover, since the number of crystal defects in the drift layer 60 disposed within the diode element region J2 is set larger than the number of crystal defects in the drift layer 60 disposed within the IGBT element region J1, the diode element region J2 is able to getter the heavy metal 62 at a higher concentration than the IGBT element region J1.

A position of the contact surface 7a between the second electrode 6 and the shallow portion 2U will now be described. An end position of the contact surface 7a on an IGBT element region J1 side in FIG. 2 is herein defined as a position P1. In addition, an end position of the emitter region 20 disposed within the IGBT element region J1 on a diode element region J2 side is herein defined as a position P2. A distance between the position P1 and the position P2 is herein defined as a separation distance A1. The heavy metal 62 diffuses in an approximately concentric pattern in the shallow portion 2U and the deep portion 2L with the contact surface 7a as a starting point. A diffusion distance of the heavy metal 62 in this case is defined as a diffusion distance A2.

The diffusion distance A2 is obtained by Expression (1) below (Arrhenius equation).

$$A2 = (D \times t)^{1/2} \quad (1),$$

where t denotes diffusion time and D denotes a diffusion coefficient. In addition, the diffusion coefficient D is obtained by Expression (2) below.

$$D = D0 \times \exp(-Ea/k \times T) \quad (2),$$

where D0 (cm$^2$/s) denotes a diffusion constant, Ea (eV) denotes activation energy, k (eV/K) denotes Boltzmann's constant, and T (K) denotes absolute temperature. Expression (1) and Expression (2) show that the diffusion distance A2 of the heavy metal is determined by a thermal history after formation of the second electrode 6 and by physical constants.

With the semiconductor device 1 according to the first embodiment, the separation distance A1 is set equal to or greater than the diffusion distance A2. Accordingly, the heavy metal 62 can be prevented from diffusing to the emitter region 20. Therefore, a situation in which an on-resistance of the IGBT element region J1 increases due to a presence of the heavy metal 62 in a vicinity of the emitter region 20 can be prevented.

For example, let us consider a case in which the heavy metal 62 is Ni and has a thermal history after the formation of the second electrode 6 of 400° C. for 1 hour. In this case, since the diffusion of the heavy metal 62 may be calculated as approximately 40 μm, the separation distance A1 need only be set to about 40 μm or longer.

Figure 3:
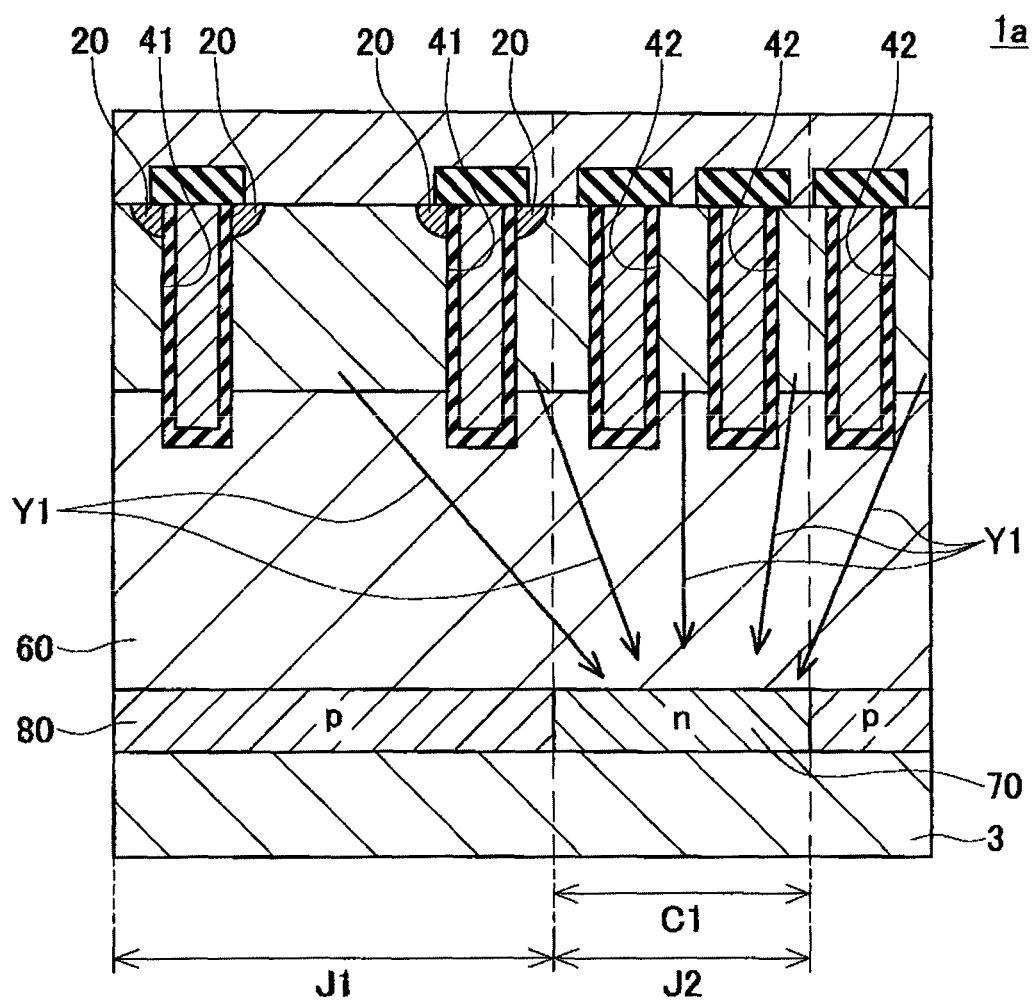

Definitions of the IGBT element region J1 and the diode element region J2 will now be described. FIG. 3 shows a partial sectional view of a reverse-conducting semiconductor device 1a. In the semiconductor device 1a shown in FIG. 3, a region in which a semiconductor region (the cathode region 70) with a same conductivity type as the drift layer 60 (n type) comes into contact with the back surface electrode 3 is defined as a collector short region C1. During operation of the semiconductor device 1a, as indicated by arrows Y1 in FIG. 3, carriers are injected toward the collector short region C1 not only from the diode element region J2 side but also from the IGBT element region J1 side. In other words, the IGBT element region J1 also operates as a diode. Therefore, it is difficult to clearly define a boundary between the IGBT element region J1 and the diode element region J2.

In consideration thereof, in the present application, a region in which a collector short region (the cathode region 70) exists and an emitter region 20 does not exist when the semiconductor device is viewed in a vertical direction (upward and downward in FIGS. 2 to 5 or the like) is defined as the diode element region J2. In the semiconductor device 1a shown in FIG. 3, the emitter region 20 does not exist above the entire collector short region C1. Therefore, with the semiconductor device 1a, a region including the entire collector short region C1 is the diode element region J2.

Figure 4:
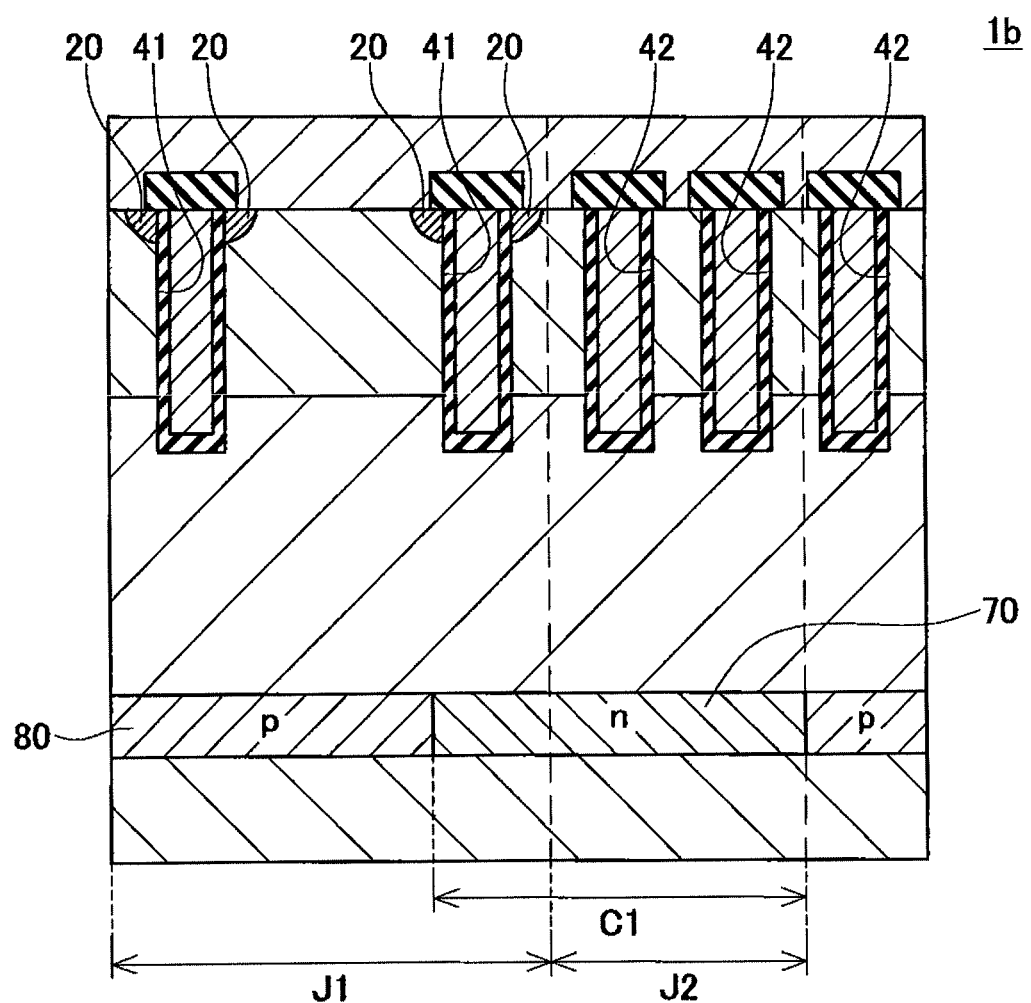
FIG. 4 is a partial sectional view of a semiconductor device 1b.

In addition, FIG. 4 shows a partial sectional view of a semiconductor device 1b. In the semiconductor device 1b, the emitter region 20 does not exist above a portion of the regions of the collector short region C1. Therefore, with the semiconductor device 1b, a portion of the regions of the collector short region C1 is the diode element region J2. As shown, the technique according to the present application is also applicable to a semiconductor device comprising a diode element region J2 that is narrower than a collector short region C1.

Figure 5:
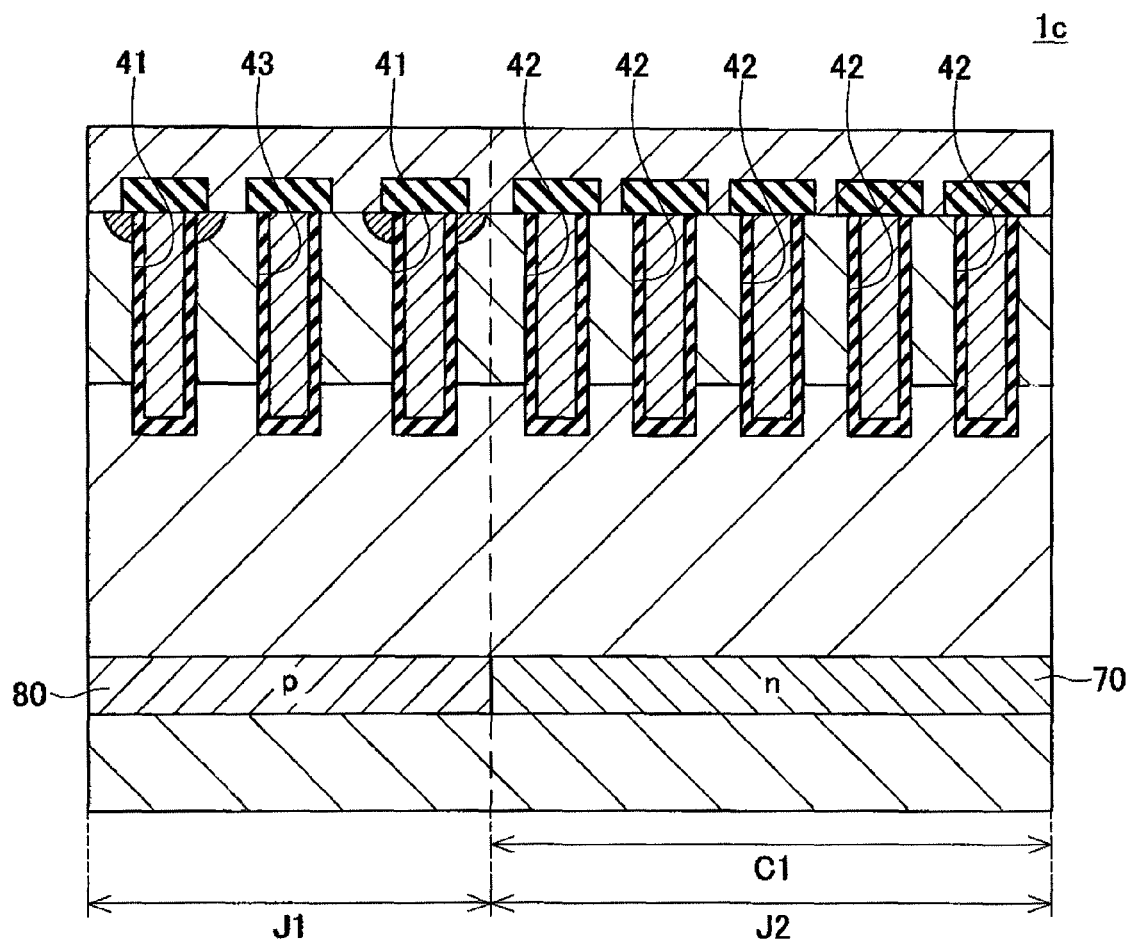
FIG. 5 is a partial sectional view of a semiconductor device 1c.

In addition, FIG. 5 shows a partial sectional view of a semiconductor device 1c. In the semiconductor device 1c, a dummy trench 43 is formed within the IGBT element region J1. The dummy trench 43 is a trench in which an emitter region 20 is not formed. A collector region 80 exists but a collector short region C1 does not exist vertically below (a lower side in FIG. 5) of the dummy trench 43. Therefore, the dummy trench 43 is not considered a diode element region J2. Moreover, modes of the dummy trench are not limited to the mode shown in FIG. 5. Dummy trenches include a trench in which a floating potential or an emitter potential is applied to a trench electrode instead of a gate potential.

Operations of the semiconductor device 1 will now be described. A case where the IGBT element region J1 enters an on-state will be described. In this case, in FIG. 2, a voltage higher than the first electrode 5 is applied to the back surface electrode 3 of the semiconductor device 1. In addition, a gate voltage (a gate on-voltage) that is equal to or higher than a threshold is applied to the first trench electrodes 11 and the second trench electrodes 12. In this case, the body layers 30 opposing the second trench electrodes 12 via the insulating films 14 in the IGBT element region J1 are inverted to become n type, and n type channels are formed. Accordingly, electrons flowed out from the emitter regions 20 are injected into the drift layer 60 via the n type channel. As a result, holes move from the collector region 80 to the drift layer 60 in the IGBT element region J1. The injection of electrons and holes into the drift layer 60 causes a conductivity modulation phenomenon and the IGBT element region J1 enters an on-state at a low on-voltage. In addition, a current flows from the back surface electrode 3 to the first electrode 5.

In addition, a case where the diode element region J2 enters a conductive state will be described. In this case, a forward voltage that is higher than the back surface electrode 3 is applied to the first electrode 5 of the semiconductor device 1. Meanwhile, a gate on-voltage is not applied to the first trench electrodes 11 and the second trench electrodes 12. In this case, an outflow of holes occurs from a body layer 30 side and an anode layer 31 side to a drift layer 60 side in both the diode element region J2 and the IGBT element region J1. On the other hand, electrons move from the cathode region 70 toward the drift layer 60. As a result, the diode element region J2 enters a conductive state. In addition, a current flows from the first electrode 5 to the back surface electrode 3.

Furthermore, a case where the diode element region J2 changes from a conductive state to a non-conductive state will be described. When the voltage of the first electrode 5 is lowered below the voltage of the back surface electrode 3 from a state where a forward voltage that is higher than the back surface electrode 3 is applied to the first electrode 5, holes stop flowing out from the anode layer 31 side to the drift layer 60 side. As a result, the diode element region J2 enters a non-conductive state. As the diode element region J2 makes a transition from a conductive state to a non-conductive state, holes injected into the drift layer 60 attempt to return to the anode layers 31. This phenomenon triggers a recovery current in the diode element region J2 that attempts to flow in a direction opposite to that in the conductive state (in other words, from the back surface electrode 3 toward a first electrode 5 side). Here, the semiconductor device 1 shown in FIG. 2 comprises a low lifetime region 61 in the drift layer 60 disposed within the diode element region J2. Accordingly, a part of the holes returning to the anode layer 31 during a recovery operation of the diode element region 32 disappears in the low lifetime region 61. Therefore, since a recovery current in the diode element region J2 can be reduced, recovery loss in the diode element region J2 can also be reduced.

In addition, in the semiconductor device 1 shown in FIG. 2, the low lifetime region 61 is not formed in the IGBT element region J1. In the IGBT element region 31, holes existing in the drift layer 60 are less likely to disappear when the IGBT element region J1 is in an on-state and conductivity modulation occurs actively. An on-voltage of the IGBT element region J1 is as low as in a case where the low lifetime region 61 is not formed. Therefore, according to the semiconductor device 1 shown in FIG. 2, recovery loss can be reduced without having to increase the on-voltage of the IGBT element region J1.

Hereinafter, advantageous effects of the semiconductor device according to the first embodiment of the present application will be described. For example, when ion irradiation is used to selectively introduce crystal defects into the diode element region J2, due to the difficulty of controlling a range and a distribution of irradiated ions, it is difficult to control a distribution of crystal defects with high accuracy. In addition, performing ion irradiation by forming an irradiation mask on a wafer surface requires a mask formation process and therefore results in an increase in fabricating cost. On the other hand, with the semiconductor device according to the first embodiment, by setting a total length of a borderline configuring an opening portion of a trench to be longer in the diode element region J2 than in the IGBT element region 31, crystal defects can be introduced into the diode element region J2 at a higher concentration. In addition, a shape and the like of trenches during formation thereof can be controlled at a higher accuracy than the range or the distribution of irradiated ions. Therefore, control of the distribution of crystal defects can be performed with higher accuracy. Furthermore, with the semiconductor device according to the first embodiment, a process for forming a trench electrode and a process for introducing defects can be unified. Since a process for introducing defects such as a process for forming an irradiation mask need not be separately provided, fabricating cost can be suppressed.

In addition, when distributing lifetime killers (crystal defects) by ion irradiation, the large number of parameters related to the range and distribution of irradiated ions makes it difficult to control the distribution of lifetime killers with high accuracy. On the other hand, in the semiconductor device 1 according to the first embodiment, lifetime killers (heavy metal) are distributed by thermal diffusion. Consequently, the distribution of lifetime killers can be controlled by the thermal history and the physical constants. Therefore, since the number of parameters that are handled is small, control of the distribution of lifetime killers can be performed at higher accuracy.

Furthermore, in the semiconductor device 1 according to the first embodiment, heavy metal is used as the lifetime killers. In addition, heavy metal is more effective as the lifetime killer than the crystal defects. Therefore, the recovery loss in the diode element region J2 can be reduced more effectively. Moreover, heavy metal has a larger diffusion coefficient than impurities (such as boron (B)) normally used in a semiconductor. For example, boron (B) used in a diffusion layer moves in an order of micrometers due to a heating process. On the other hand, heavy metal moves in an order of millimeters due to a heating process. By controlling trench concentration so that crystal defects are formed in a higher concentration in the diode element region J2 than in the IGBT element region J1, heavy metal is gettered in a higher concentration in the diode element region J2. Therefore, even if heavy metal is inadvertently introduced to the IGBT element region J1 side, heat during the fabricating process causes the heavy metal to move to the diode element region J2 and the heavy metal is gettered by the crystal defects in the diode element region J2. In other words, due to the heating process, the heavy metal can be moved so that the concentration of heavy metal included in the drift layer 60 of the diode element region J2 becomes higher than the concentration of heavy metal included in the drift layer 60 of the IGBT element region J1. Consequently, since the low lifetime region can be provided in the diode element region J2 at a high accuracy, the recovery loss in the diode element region J2 can be reduced.

Furthermore, in the semiconductor device according to the first embodiment, the second electrode 6 including the heavy metal is structured so as to be in contact with a portion of the diode element region J2 at the contact surface 7a. Accordingly, the second electrode 6 can also be used as a member for introducing heavy metal. Since an exclusive member for introducing heavy metal need not be separately provided, fabricating cost can be suppressed.

In addition, there is a conventional configuration in which crystal defects are formed concentrated in a vicinity of a tip of a trench in the diode element region J2. However, the tip of a trench is one of the portions at which electric field is the highest. Therefore, forming crystal defects concentrated in the vicinity of the tip of a trench creates a risk of increasing a leakage current or a risk of accelerating carriers due to the high electric field to increase a likelihood of an occurrence of avalanche breakdown. On the other hand, in the semiconductor device according to the first embodiment, a trench interval in the diode element region J2 is set narrower than a trench interval in the IGBT element region J1. Therefore, in the diode element region J2, due to thermal stress generated over the entire second trenches 42, the crystal defects can be formed not only in the vicinities of the tips of the second trenches 42 but over a wide range surrounding each second trench 42. Accordingly, an occurrence of a leakage current or avalanche breakdown can be prevented.

Furthermore, in the semiconductor device according to the first embodiment, the trench interval in the diode element region J2 is set narrower than the trench interval in the IGBT element region J1. Therefore, since depletion layers are more readily connected between adjacent trenches in the diode element region J2, an increase in the electric field at the tips of the trenches can be suppressed. Accordingly, a breakdown voltage of the IGBT element region J1 and a breakdown voltage of the diode element region J2 can be individually adjusted without having to use a substrate resistance or the like. In other words, the breakdown voltage of the diode element region J2 can be set higher than the breakdown voltage of the IGBT element region J1. As a result, since an area of the diode element region J2 can be reduced while securing an avalanche resistance (fracture resistance) (thermal mass), a reduction in chip size can be achieved.

Second Embodiment

Figure 6:
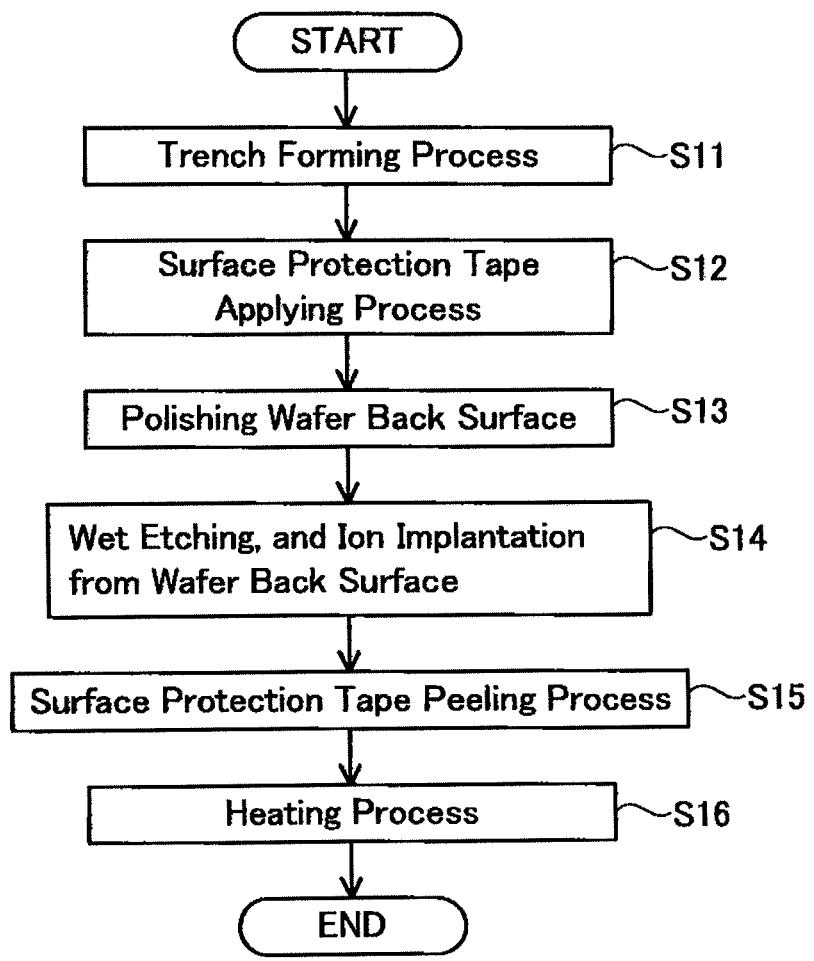
FIG. 6 is a diagram for describing a fabricating process of the semiconductor device 1.
Figure 7:
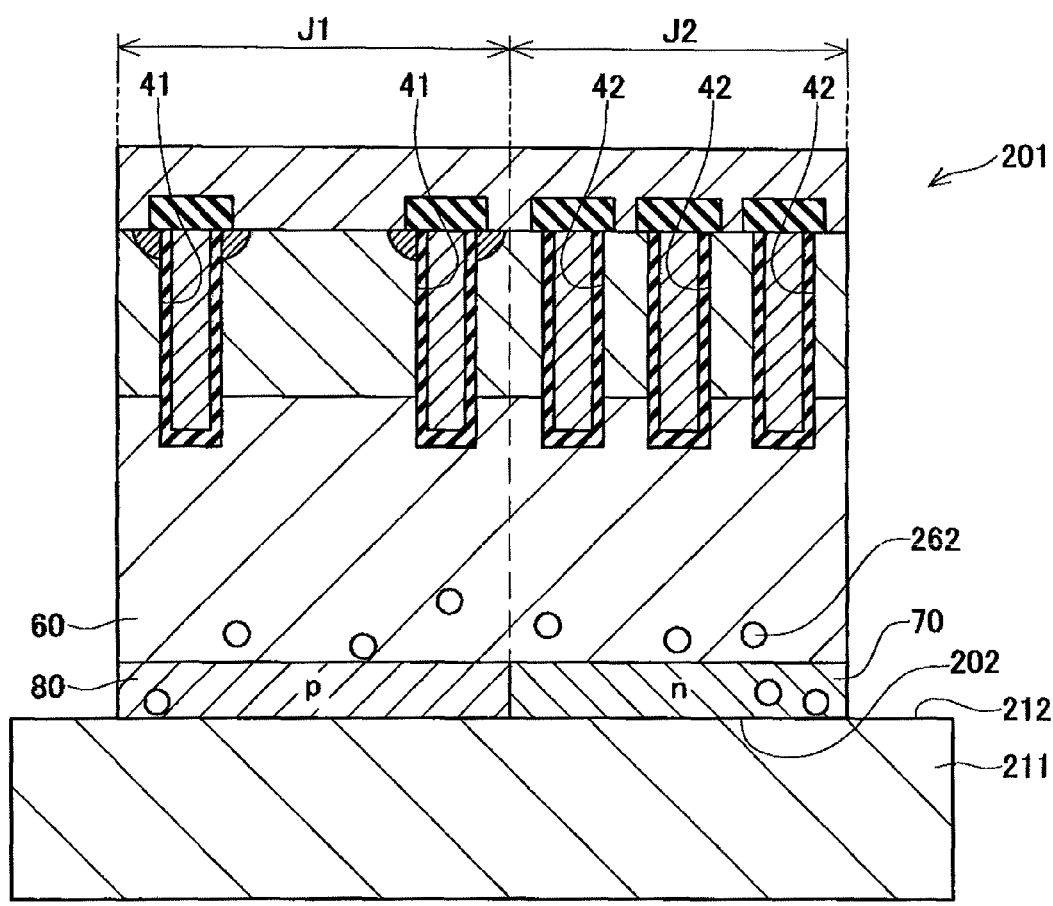
FIG. 7 is a partial sectional view of the semiconductor device 1.
Figure 8:
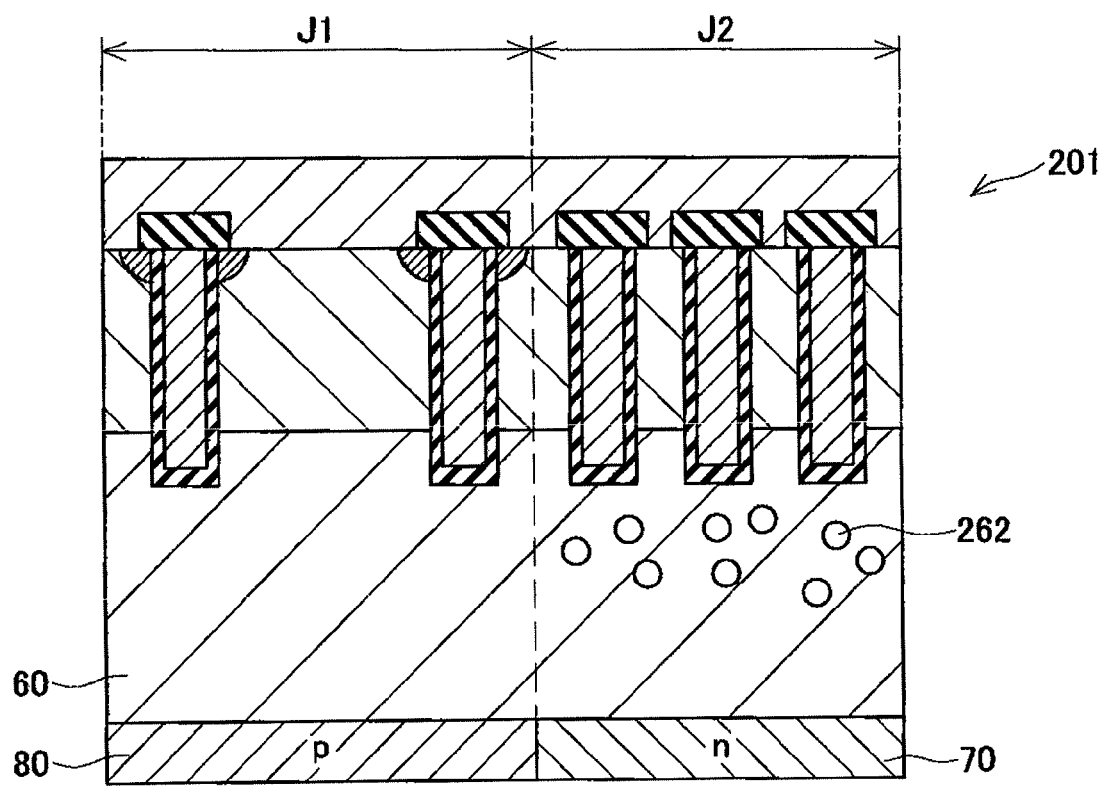
FIG. 8 is a partial sectional view of the semiconductor device 1.

A method for fabricating a semiconductor device according to the present application will now be described with reference to the flow chart shown in FIG. 6 and to the sectional views of substantial parts shown in FIGS. 7 and 8. In step S11 in FIG. 6, trenches are formed from a wafer surface side in the IGBT element region J1 and the diode element region J2. In doing so, a concentration of formation of the second trenches 42 formed in the diode element region J2 is set higher than a concentration of formation of the first trenches 41 formed in the IGBT element region J1. In addition, the formation of trenches is performed in a state where a heavy metal gettering layer exists on a wafer back surface. The gettering layer is a layer for trapping impurities such as heavy metal. Due to the gettering layer, heavy metal contamination of a device active region can be prevented. Moreover, since conventionally known processes can be used as the process for forming an element structure on the wafer surface, a description thereof will be omitted.

In step S12, surface protection tape is applied to the wafer surface. Accordingly, since the wafer surface side can be brought into contact with a stage or the like, the wafer can be placed on the stage so as to display a wafer back surface side. In step S13, polishing of the back surface of the wafer is performed. Accordingly, the heavy metal gettering layer that had been formed on the wafer back surface is removed. In step S14, wet etching is performed to clean the polished surface of the wafer. In addition, ion implantation is performed from the wafer back surface to form the cathode region 70 and the collector region 80 (FIG. 2).

In step S15, a peeling process of the surface protection tape is performed. In the peeling process, as shown in FIG. 7, a wafer 201 is placed on a stage 211 so that a back surface 202 of the wafer 201 comes into contact with a surface 212 of the stage 211. In addition, a portion of the stage 211 in contact with the back surface 202 of the wafer 201 is formed by a material including heavy metal. Accordingly, as shown in FIG. 7, heavy metal 262 of the stage 211 is introduced into the wafer 201 via a contact portion between the back surface 202 of the wafer 201 and the surface 212 of the stage 211. The heavy metal 262 is depicted as white circles in FIG. 7.

In step S16, a heating process is performed. Due to the heating process, the heavy metal 262 in the wafer 201 is diffused. In addition, due to the trench concentration control in step S11 described earlier, crystal defects are formed at a higher concentration in the diode element region J2. Therefore, as shown in FIG. 8, the heavy metal 262 is gettered at a higher concentration by the side of the diode element region J2. In other words, due to the heating process, the heavy metal 262 can be moved so that the concentration of heavy metal included in the drift layer 60 of the diode element region J2 becomes higher than the concentration of heavy metal included in the drift layer 60 of the IGBT element region J1. Furthermore, due to the heating process, regions of the wafer back surface in which ion implantation had been performed (the cathode region 70 and the collector region 80) can be activated.

Hereinafter, advantageous effects of the method for fabricating a semiconductor device according to the second embodiment of the present application will be described. Conventionally, introducing a lifetime killer (carbon, oxygen, or the like) sometimes requires performing a separate process such as an implantation process. On the other hand, with the method for fabricating a semiconductor device according to the second embodiment, a stage using a heavy metal material is brought into contact with a wafer in a surface protection tape peeling process (step S15). Accordingly, in the surface protection tape peeling process, heavy metal that is a lifetime killer can be automatically introduced into the wafer. Since an exclusive process for introducing a lifetime killer need not be separately provided, fabricating cost can be suppressed.

In addition, the fabricating method according to the second embodiment comprises a heating process (step S16) after the process for bringing the wafer into contact with the stage using heavy metal material (step S15). Accordingly, heavy metal introduced from the stage can be diffused and gettered by minute defects. As a result, due to the heating process, the heavy metal can be moved so that a concentration of heavy metal included in the drift layer 60 of the diode element region J2 becomes higher than a concentration of heavy metal included in the drift layer 60 of the IGBT element region J1.

Furthermore, with the fabricating method according to the second embodiment, even when a gettering layer has been formed on the wafer back surface, heavy metal can be introduced into the wafer in a state where the gettering layer has been removed by a process for polishing the wafer back surface (step S13). As a result, sufficient diffusion of the heavy metal in the semiconductor layer can be achieved.

While embodiments of the present invention have been described in detail, such embodiments are merely illustrative and are not intended to limit the scope of claims. Techniques described in the scope of claims include various modifications and changes made to the specific examples illustrated above.

Modifications of First Embodiment

Figure 9:
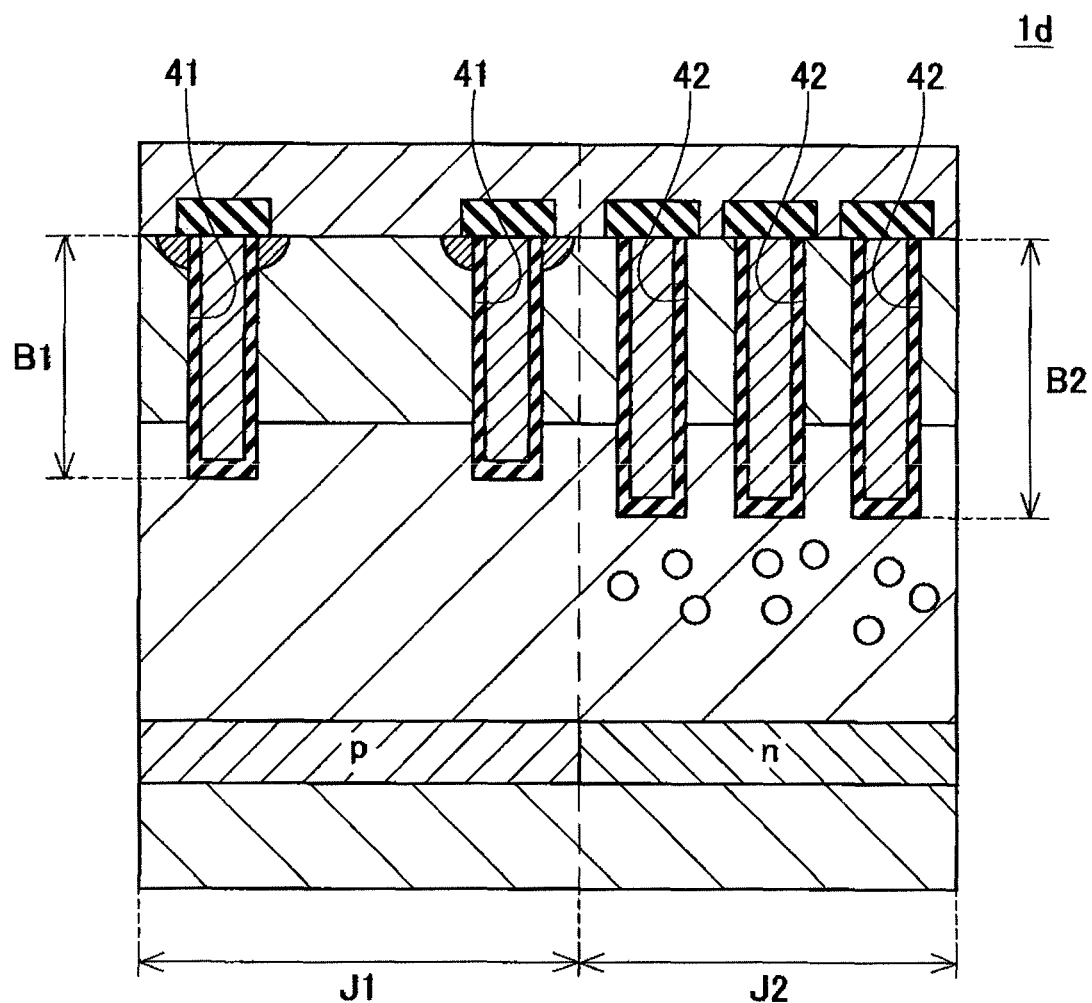
FIG. 9 is a partial sectional view of a semiconductor device 1d.

Hereinafter, modifications of the semiconductor device according to the first embodiment will be described. FIG. 9 shows a partial sectional view of a semiconductor device 1d. The semiconductor device 1d differs from the semiconductor device 1 (FIG. 2) in that a depth B2 of the second trenches 42 disposed within the diode element region J2 is set deeper than a depth B1 of the first trenches 41 disposed within the IGBT element region J1. Accordingly, thermal stress can be generated over even a wider region in a depth direction in the diode element region J2 than in the IGBT element region J1. Therefore, crystal defects can be formed at a higher concentration in the diode element region J2.

Figure 10:
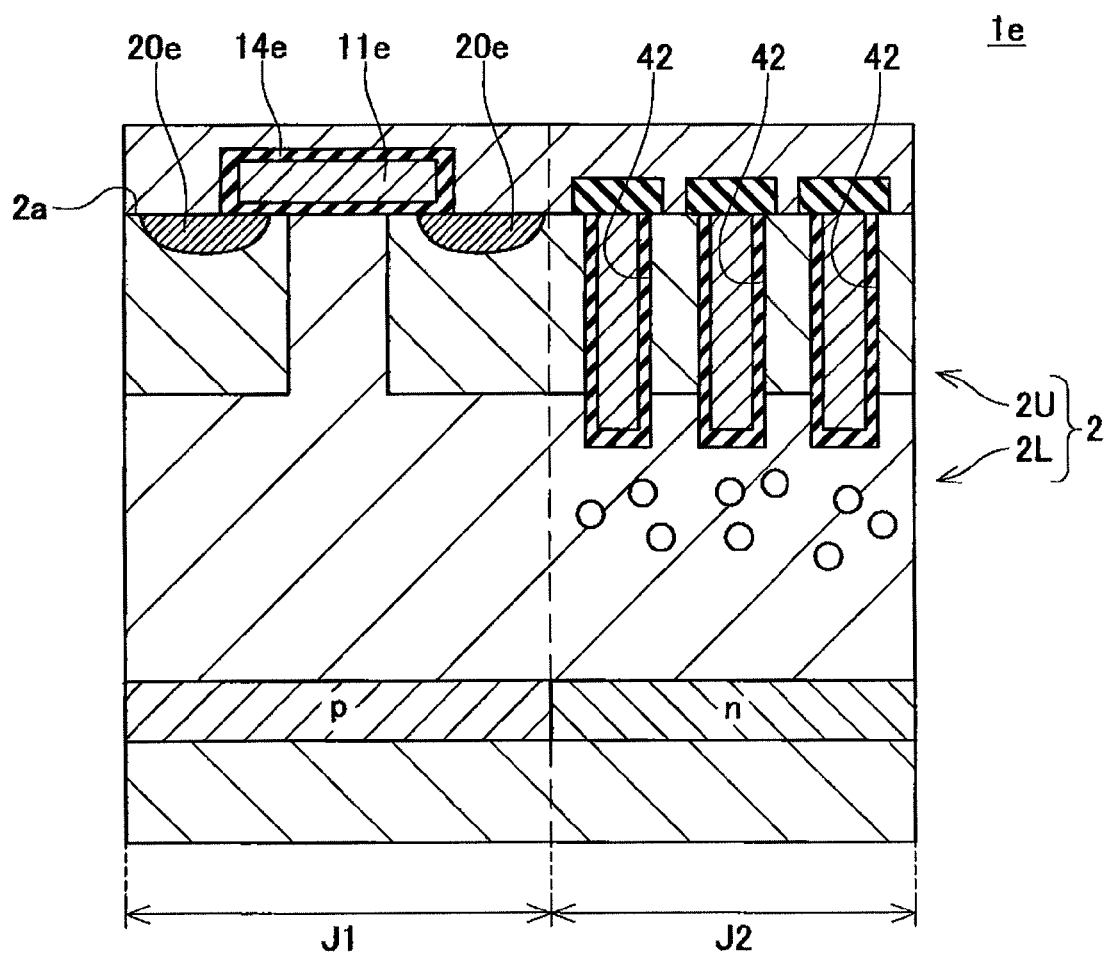
FIG. 10 is a partial sectional view of a semiconductor device 1e.

In addition, FIG. 10 shows a partial sectional view of a semiconductor device 1e. The semiconductor device 1e differs from the semiconductor device 1 (FIG. 2) in that the IGBT element region J1 comprises a planer type first electrode 11e. The first electrode 11e is formed on the surface 2a of the semiconductor layer 2 while being enclosed by an insulating film 14e. An emitter region 20e has a portion exposed at the surface 2a of the semiconductor layer 2 and a portion in contact with the first electrode 11e. Accordingly, a structure can be produced in which trenches are not formed in the IGBT element region 31 and are only formed in the diode element region J2. Therefore, since crystal defects due to trenches can be formed exclusively in the diode element region J2, crystal defects can be generated at an even higher concentration in the diode element region J2 than in the IGBT element region 31.

Furthermore, while a case in which the first trenches 41 and the second trenches 42 are arranged in a striped pattern has been described in the first embodiment as shown in the plan view of FIG. 1, modes are not limited thereto. Various trench arrangements can be adopted as illustrated by examples of semiconductor devices 1f (FIG. 11) to 1i (FIG. 14) described below. In FIGS. 11 to 14, trench portions are depicted by hatchings. In addition, in the semiconductor devices 1f to 1i, trenches are formed at a higher concentration in the diode element region J2 than in the IGBT element region 31.

Figure 11:
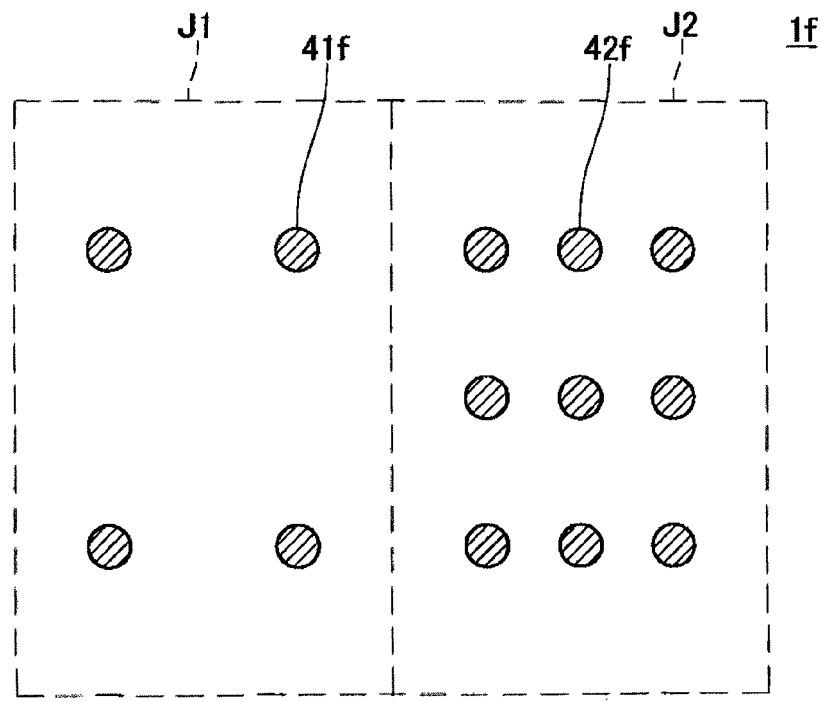
FIG. 11 is a plan view of a semiconductor device 1f.

The semiconductor device 1f shown in FIG. 11 is an example in which trenches are arranged in a dotted pattern. In the semiconductor device 1f, opening portions of first trenches 41f and second trenches 42f have circular shapes. In addition, four first trenches 41f are formed in the IGBT element region J1, and nine second trenches 42f are formed in the diode element region J2.

Figure 12:
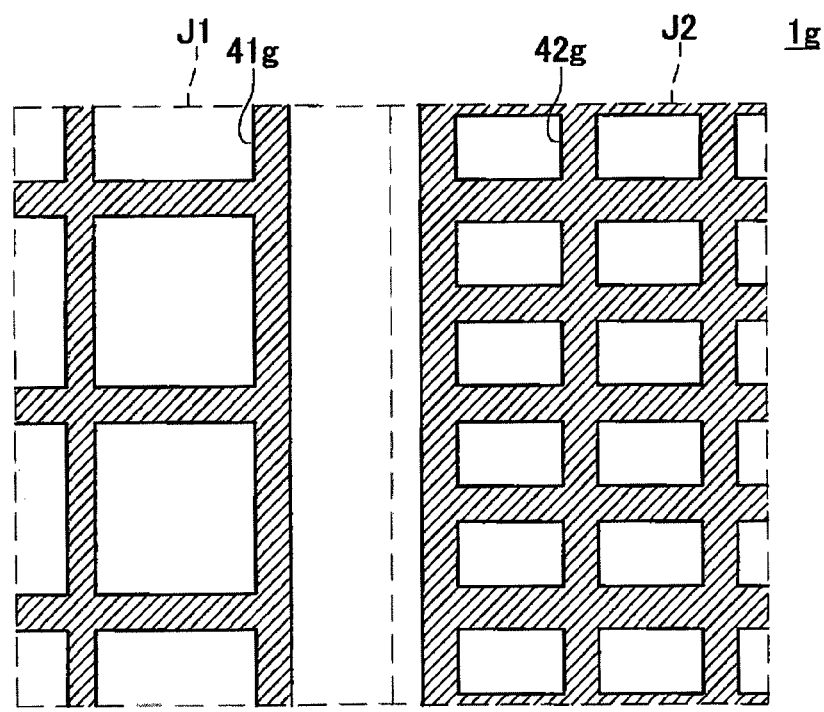
FIG. 12 is a plan view of a semiconductor device 1g.

The semiconductor device 1g shown in FIG. 12 is an example in which trenches are arranged in a grid pattern. In addition, a grid concentration is set higher in the diode element region J2 than in the IGBT element region J1. Therefore, a total length of a borderline configuring an opening portion of a second trench 42g is longer than a total length of a borderline configuring an opening portion of a first trench 41g.

Figure 13:
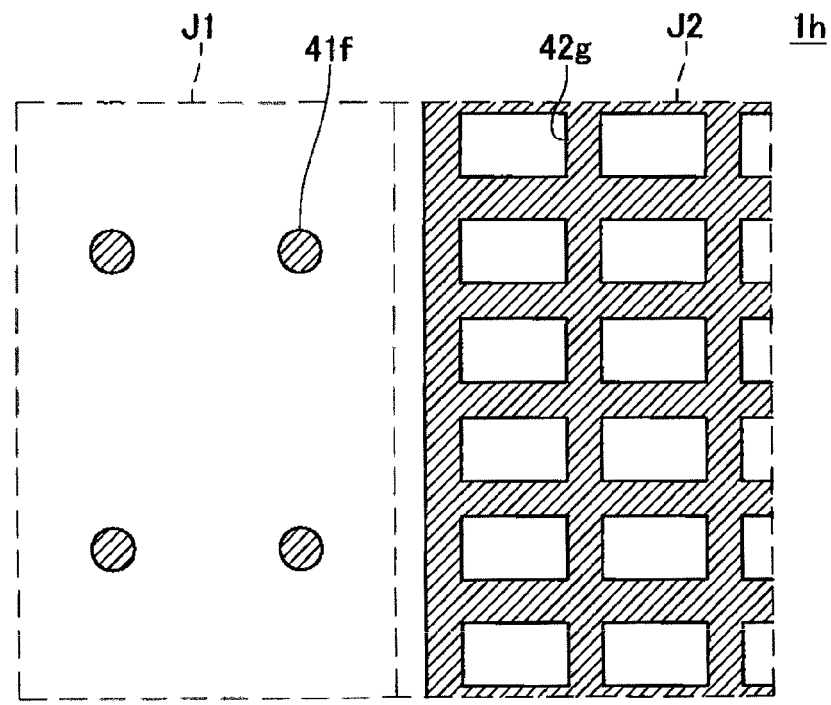
FIG. 13 is a plan view of a semiconductor device 1h.

The semiconductor device 1h shown in FIG. 13 is an example in which first trenches 41f in a dotted pattern (FIG. 11) and a second trench 42g in a grid pattern (FIG. 12) are arranged in combination.

Figure 14:
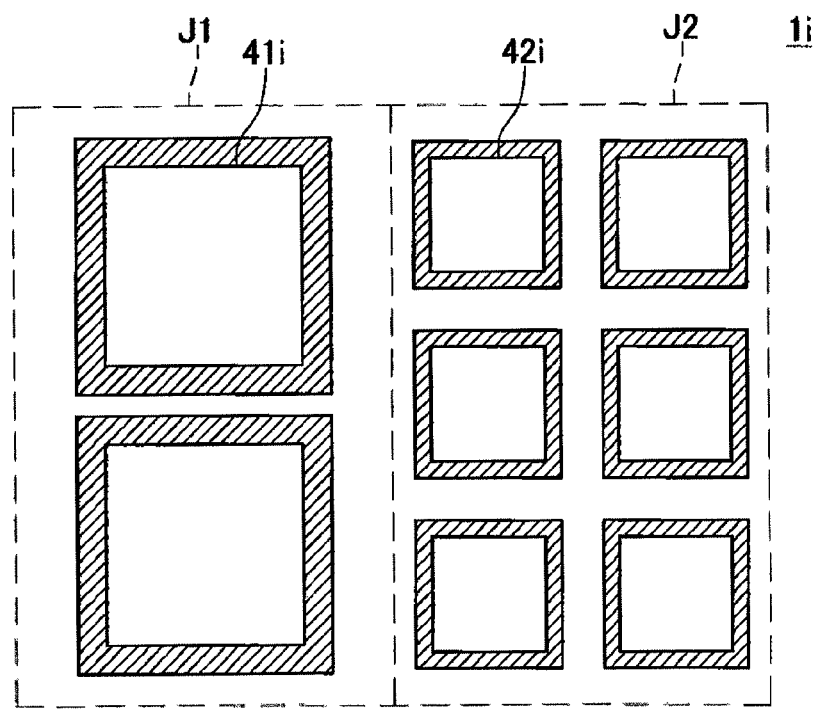
FIG. 14 is a plan view of a semiconductor device 1i.

The semiconductor device 1i shown in FIG. 14 is an example in which trenches are arranged in a discontinuous grid pattern. In addition, a grid concentration is set higher in the diode element region J2 than in the IGBT element region J1. Therefore, a total length of borderlines configuring opening portions of second trenches 42i is longer than a total length of borderlines configuring opening portions of first trenches 41i.

Furthermore, methods of determining the separation distance A1 (FIG. 2) are not limited to a method based on the diffusion distance A2. For example, the separation distance A1 may be determined so as to equal or exceed a distance A3 (FIG. 2) that is determined by a sum of a thickness of the anode layers 31 and a thickness of the drift layer 60 in the diode element region J2. Accordingly, since the diffusion of heavy metal to the emitter region 20 in the IGBT element region J1 can be prevented, a situation where the on-resistance of the IGBT element region J1 increases can be prevented.

Figure 15:
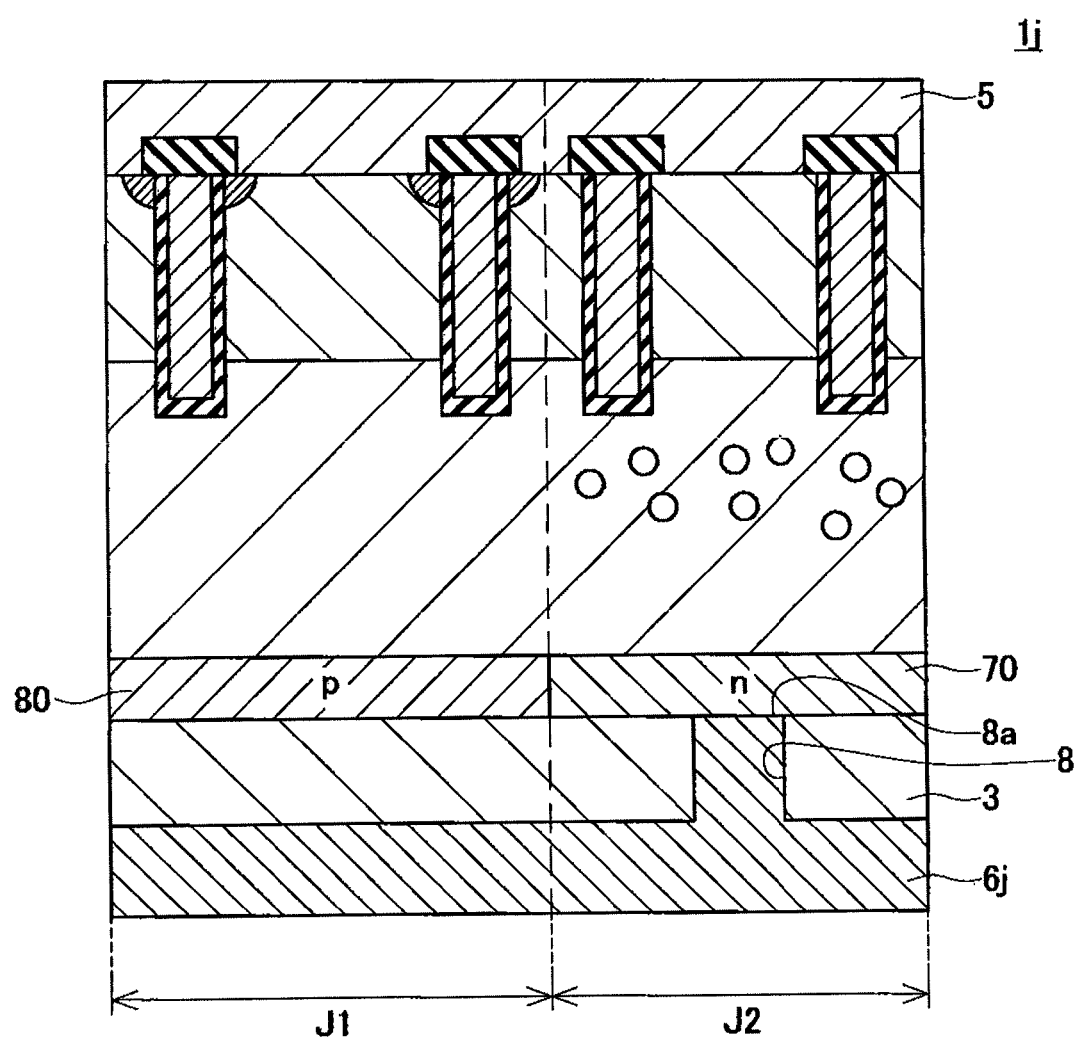
FIG. 15 is a partial sectional view of a semiconductor device 1j.

In addition, arrangements of the second electrode including heavy metal are not limited to the example shown in FIG. 2. In a semiconductor device 1j shown in FIG. 15, a second electrode 6j is formed on the surface of the back surface electrode 3 and inside the trench 8. Therefore, the second electrode 6j is in contact with a portion of the cathode region 70 disposed within the diode element region J2 via a contact surface 8a. In addition, in a semiconductor device 1k shown in FIG. 16, a second electrode 6k is formed inside a hollow portion 9 of the first electrode 5. Therefore, the second electrode 6k is not exposed at a surface of the semiconductor device 1k. Furthermore, the second electrode 6k is in contact with a portion of the shallow portion 2U in the diode element region J2 via a contact surface 9a.

Figure 17:
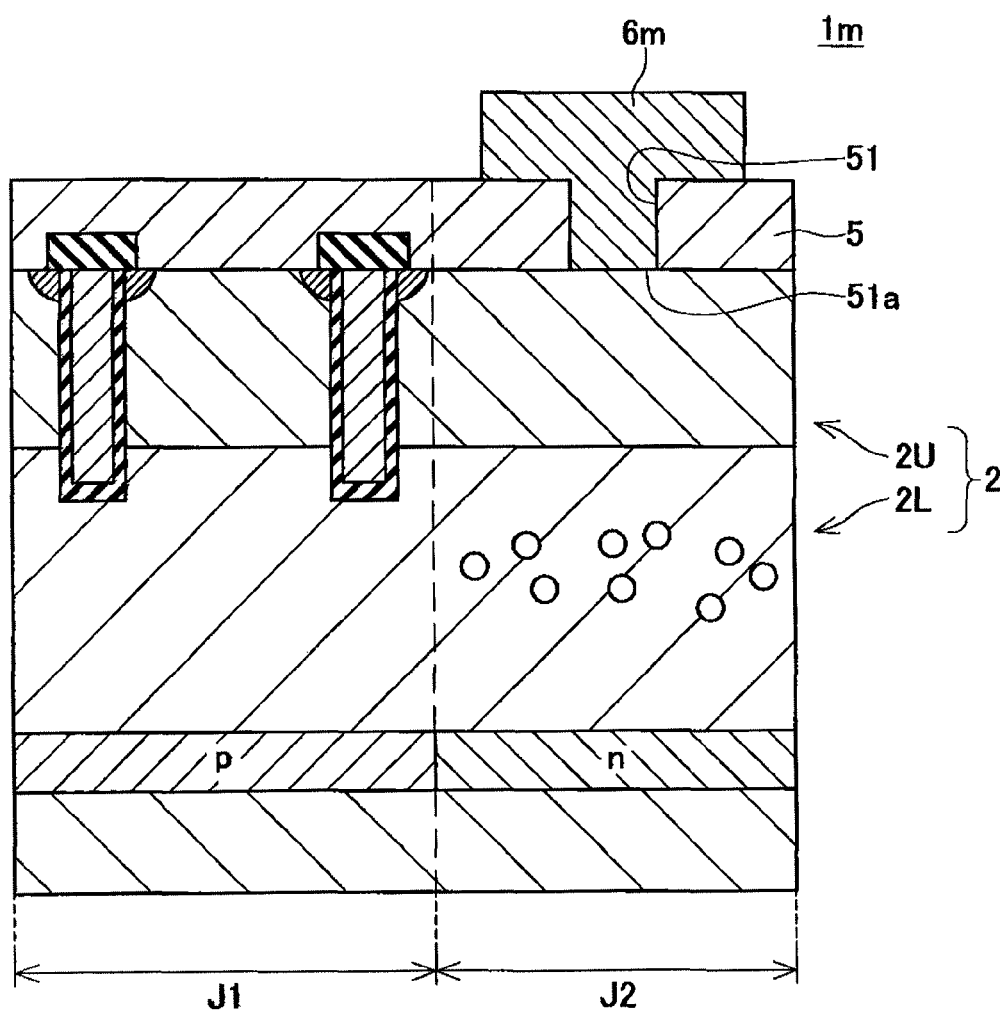
FIG. 17 is a partial sectional view of a semiconductor device 1m.

In a semiconductor device 1m shown in FIG. 17, a second electrode 6m is formed on the surface of the first electrode 5 and inside a trench 51 in the diode element region J2. Furthermore, the second electrode 6m is in contact with a portion of the shallow portion 2U in the diode element region J2 via a contact surface 51a. In a semiconductor device 1n shown in FIG. 18, a second electrode 6n is formed on the surface of the back surface electrode 3 and inside a trench 52 in the diode element region J2. In addition, the second electrode 6n is in contact with a portion of the cathode region 70 disposed within the diode element region J2 via a contact surface 52a.

Figure 16:
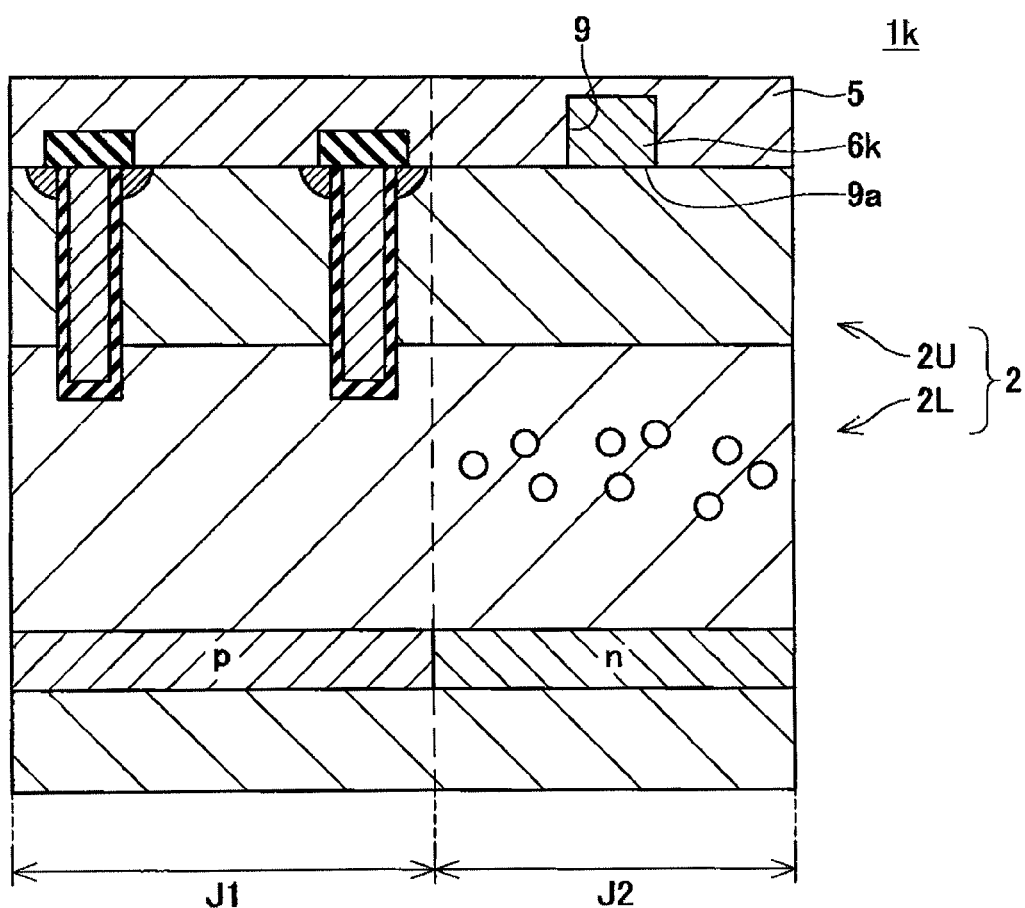
FIG. 16 is a partial sectional view of a semiconductor device 1k.
Figure 18:
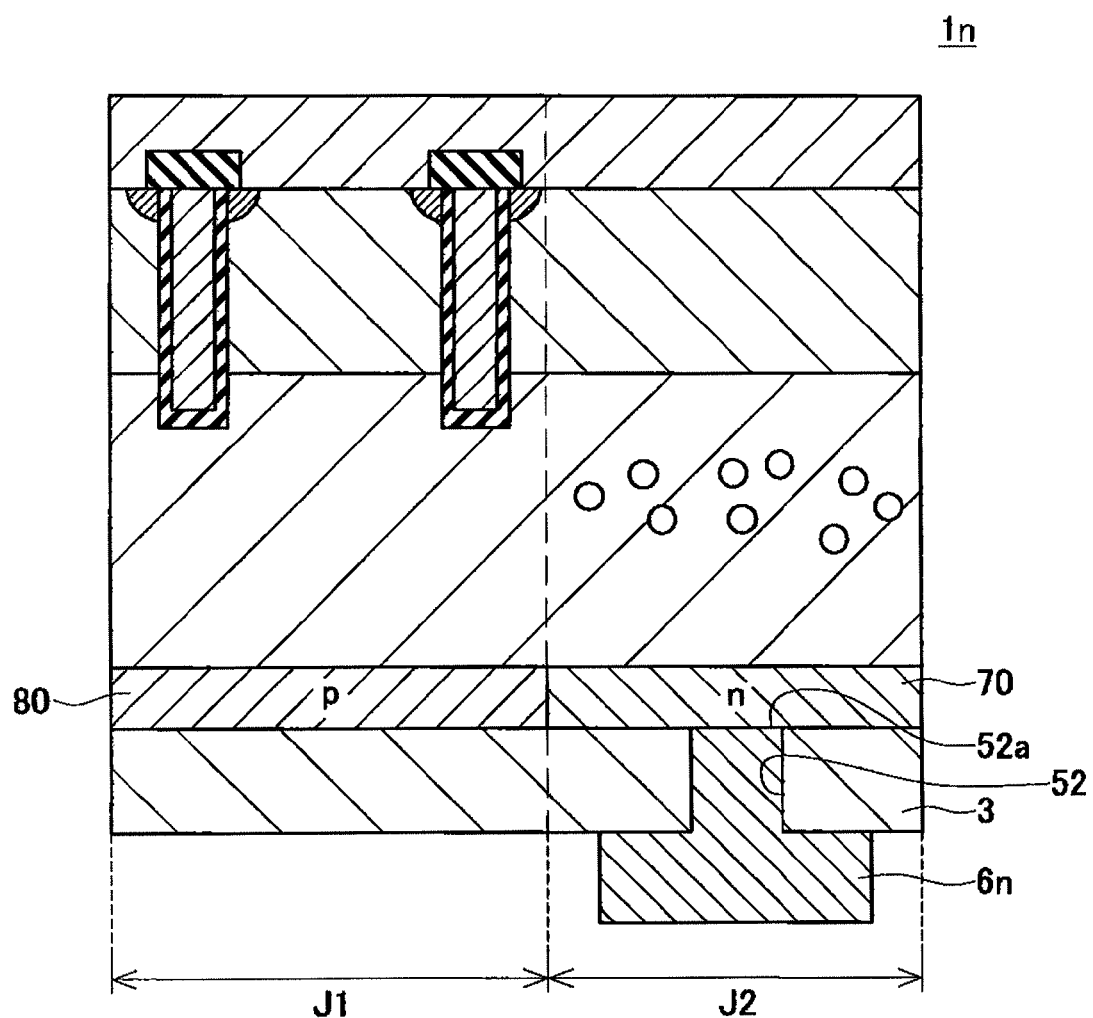
FIG. 18 is a partial sectional view of a semiconductor device 1n.

Furthermore, in the semiconductor device according to the present application, it is important to set a concentration of heavy metal included in the drift layer 60 of the diode element region J2 higher than a concentration of heavy metal included in the drift layer 60 of the IGBT element region J1. Therefore, crystal defects need not necessarily be introduced into the drift layer 60 disposed within the diode element region J2. As a result, a mode can be adopted in which trenches are not formed in the diode element region J2 as shown in FIGS. 16 to 18.

Figure 19:
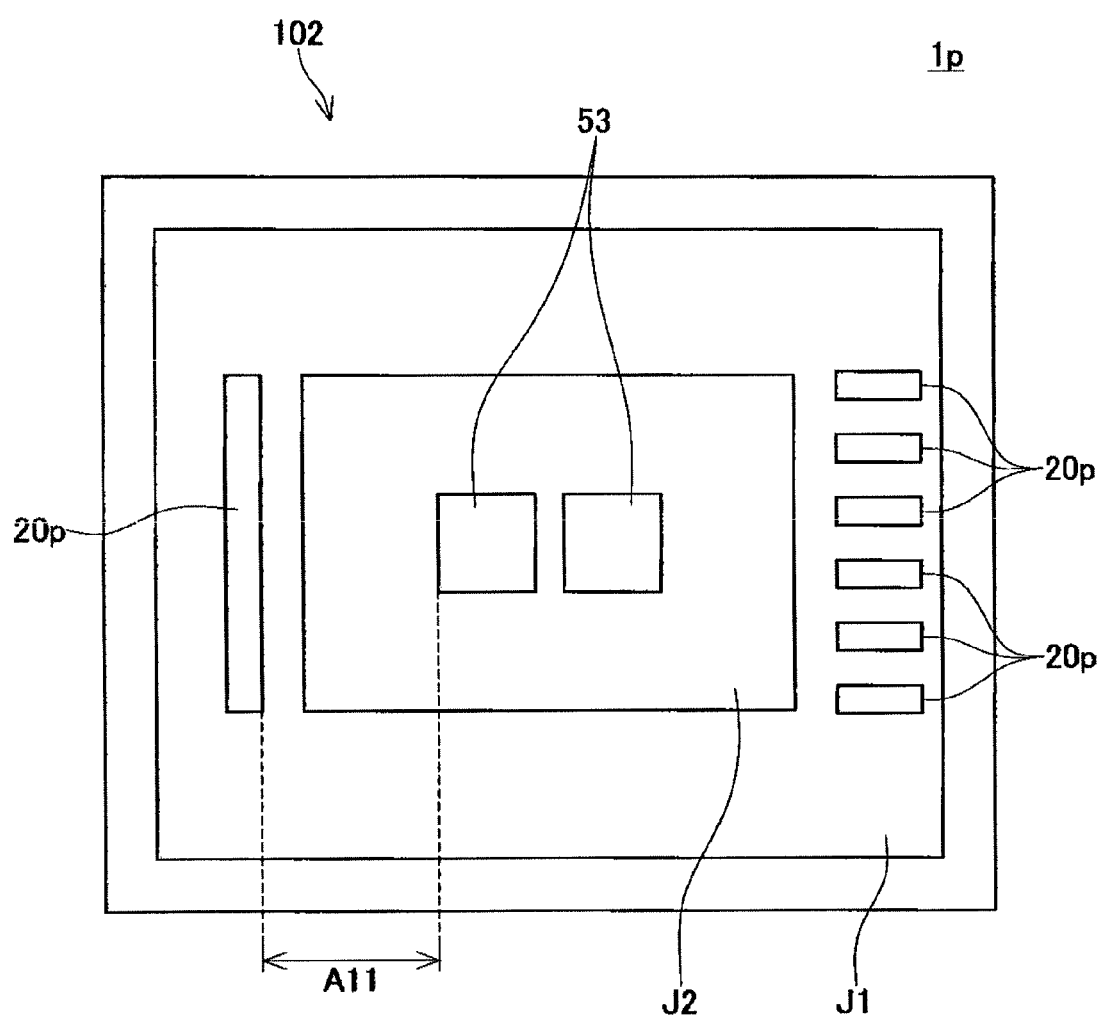
FIG. 19 is a top view of a semiconductor device 1p.

In addition, various arrangements of the second electrode, the IGBT element region J1, the diode element region J2, and the like on the surface of the semiconductor device may be adopted. FIG. 19 shows a top view of a separate reverse-conducting semiconductor device 1p. A separate semiconductor device refers to a semiconductor device in which the IGBT element region 31 and the diode element region J2 are respectively consolidated into one region. Two contact surfaces 53 that come into contact with a second electrode including heavy metal are formed within the diode element region J2. Furthermore, a plurality of emitter regions 20p is formed within the IGBT element region J1. Now, if a shortest distance between the contact surfaces 53 and the emitter regions 20p is defined as a separation distance A11, the separation distance A11 is favorably set equal to or greater than the diffusion distance A2 or the distance A3 described earlier. Moreover, the contact surfaces 53 and the emitter regions 20p may assume various shapes such as a dotted shape or a striped shape, or a mixture of various shapes may be adopted.

Figure 20:
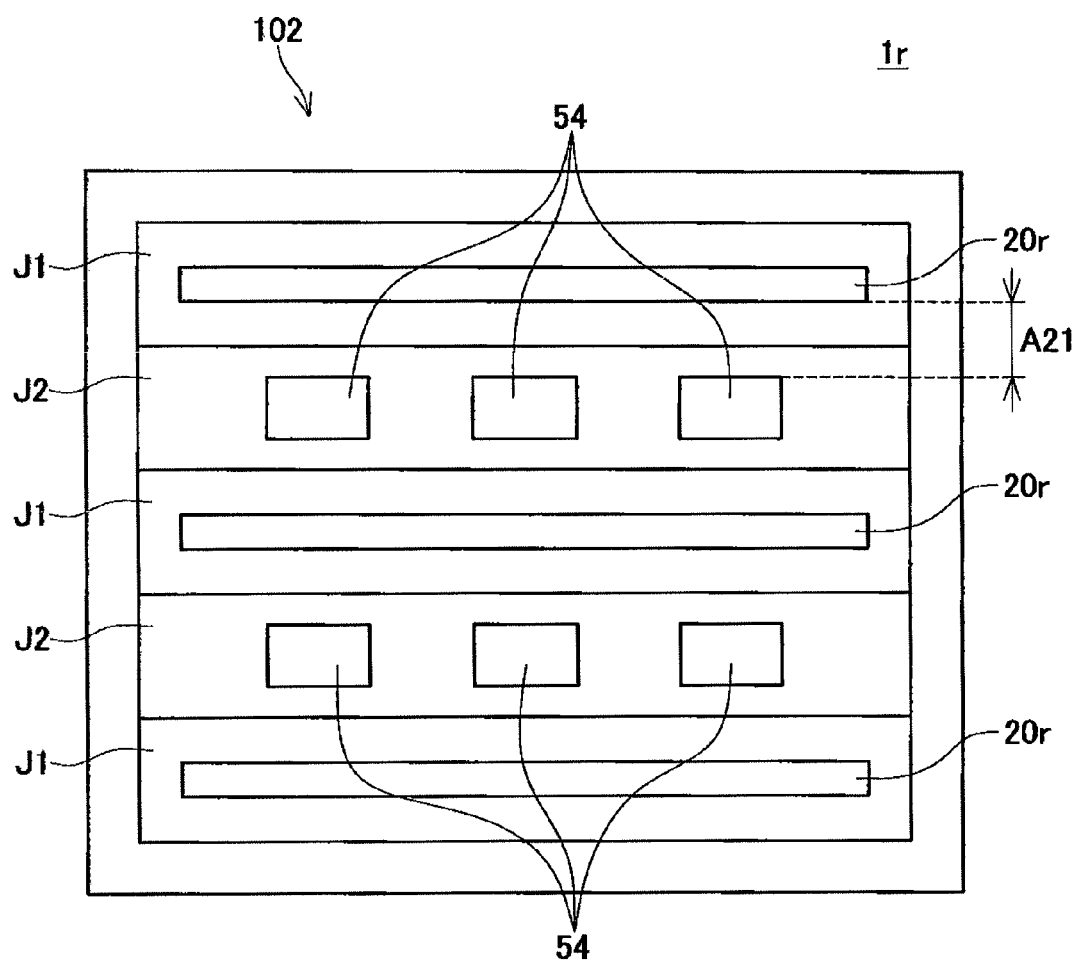
FIG. 20 is a top view of a semiconductor device 1r.

FIG. 20 shows a top view of a mixed reverse-conducting semiconductor device 1r. A mixed semiconductor device refers to a semiconductor device in which the IGBT element region 31 and the diode element region J2 are respectively divided into a plurality of regions. In the semiconductor device 1r, three IGBT element regions 31 and two diode element regions 32 are alternately arranged. Three contact surfaces 54 that come into contact with a second electrode including heavy metal are formed within each diode element region J2. In addition, an emitter region 20r is formed within the IGBT element region J1. Now, if a shortest distance between the contact surfaces 54 and the emitter region 20r is defined as a separation distance A21, the separation distance A21 is favorably set equal to or greater than the diffusion distance A2 or the distance A3 described earlier.

In addition, an electrode used for another purpose can be appropriated as the second electrode including the heavy metal. For example, in a case of mold mounting, an electrode including Ni for forming a eutectic is required between solder and an element. In this case, an electrode formed of Ni (which corresponds to the second electrode 6 in FIG. 2) is formed on a surface of an electrode formed of Al (which corresponds to the first electrode 5 in FIG. 2). Accordingly, since an exclusive electrode for introducing heavy metal need not be separately formed, fabricating cost can be suppressed. Moreover, an electrode formed of Ni can be formed using various methods such as plating and sputtering.

Furthermore, a mode may be adopted in which, in FIGS. 2, 7, and 15 to 18, the second electrode including heavy metal is in contact with a semiconductor layer disposed within the diode element region J2 via an interlayer. An interlayer is a layer that has a property of diffusing heavy metal. In addition, a thickness of the interlayer is set smaller than a diffusion distance A2 of heavy metal included in the electrode. Examples of an interlayer include a silicon oxide film. Accordingly, even in a case where an interlayer such as a natural oxide film exists, heavy metal can be sufficiently diffused in the semiconductor layer due to a heating process after electrode formation.

In addition, the heavy metal included in the second electrode may be a metal with a specific gravity equal to or exceeding 4. Examples include iron, lead, gold, platinum, silver, copper, chromium, cadmium, mercury, zinc, arsenic, manganese, cobalt, nickel, molybdenum, tungsten, tin, bismuth, uranium, and plutonium.

Modification of Second Embodiment

Hereinafter, a modification of the method for fabricating a semiconductor device according to the second embodiment will be described. A mode may be adopted in which a transport stage for introducing heavy metal is used after back surface polishing is performed in step S13 shown in FIG. 6. The transport stage is an entire surface-holding stage comprising a holding surface that comes into contact with an entire back surface of a wafer. In addition, the holding surface is formed of a material including heavy metal. Accordingly, by having the holding surface and the wafer back surface come into contact with each other during wafer transport, heavy metal can be introduced into the wafer. In addition, since a likelihood of an occurrence of warpage or deflection can be reduced by holding the entire surface of a wafer, a large-sized wafer or a thinned wafer can be transported in a reliable manner. Moreover, the transport stage for introducing heavy metal may be used at any timing between the removal of the heavy metal gettering layer from the back surface of the wafer and the conclusion of heavy metal gettering by the heating process.

While specific examples of the present invention have been described in detail, such examples are merely illustrative and are not intended to limit the scope of claims. In addition, it is to be understood that the technical elements described in the present specification and the drawings exhibit technical usefulness solely or in various combinations thereof and shall not be limited to the combinations described in the claims at the time of filing. Furthermore, the techniques illustrated in the present specification and the drawings are to achieve a plurality of objectives at the same time, whereby technical usefulness is exhibited by attaining any one of such objectives.

The invention claimed is:

1. A semiconductor device comprising:
   an IGBT element region and a diode element region that are formed in one semiconductor substrate, wherein
   a first conductivity type collector layer, a second conductivity type drift layer, and a first conductivity type body layer are sequentially laminated in the IGBT element region,
   a first trench electrode that penetrates the body layer from a surface of the body layer, projects into the drift layer and is surrounded by an insulating film is formed,
   a second conductivity type emitter region is formed at a particular area that makes contact with the first trench electrode via the insulating film and is exposed at a surface of the semiconductor substrate,
   the emitter region being separated from the drift layer by the body layer,
   a second conductivity type cathode layer, a second conductivity type drift layer, and a first conductivity type anode layer are sequentially laminated in the diode element region,
   a second trench electrode that penetrates the anode layer from a surface of the anode layer, projects into the drift layer and is surrounded by an insulating film is formed,
   when the surface of the body layer on which an opening portion of the first trench electrode is formed and the surface of the anode layer on which an opening portion of the second trench electrode is formed are observed, a total length, per unit area of the diode element region, of a borderline configuring the opening portion of the second trench electrode is longer than a total length, per unit area of the IGBT element region, of a borderline configuring the opening portion of the first trench electrode, and
   a concentration of heavy metal included in the drift layer of the diode element region is higher than a concentration of heavy metal included in the drift layer of the IGBT element region.

2. The semiconductor device according to claim 1, further comprising:
   an electrode including the heavy metal,
   wherein the electrode makes contact with at least a portion of a semiconductor layer disposed within the diode element region.

3. The semiconductor device according to claim 2, wherein a first distance between a contacting region and the emitter region disposed within the IGBT element region is equal to or more than a second distance,
   the contacting region being a region at which the electrode including the heavy metal and the semiconductor layer disposed within the diode element region make contact, and
   the second distance being a distance determined by a sum of a thickness of the anode layer of the diode element region and a thickness of the drift layer of the diode element region.

4. A semiconductor device comprising:
   an IGBT element region and a diode element region that are formed in one semiconductor substrate, wherein
   a first conductivity type collector layer, a second conductivity type drift layer, and a first conductivity type body layer are sequentially laminated in the IGBT element region,
   a first trench electrode that penetrates the body layer from a surface of the body layer, projects into the drift layer and is surrounded by an insulating film is formed,
   a second conductivity type emitter region is formed at a particular area that makes contact with the first trench electrode via the insulating film and is exposed at a surface of the semiconductor substrate,
   the emitter region being separated from the drift layer by the body layer,
   a second conductivity type cathode layer, a second conductivity type drift layer, and a first conductivity type anode layer are sequentially laminated in the diode element region,
   a second trench electrode that penetrates the anode layer from a surface of the anode layer, projects into the drift layer and is surrounded by an insulating film is formed, and
   when the surface of the body layer on which an opening portion of the first trench electrode is formed and the surface of the anode layer on which an opening portion of the second trench electrode is formed are observed, a total length, per unit area of the diode element region, of a borderline configuring the opening portion of the second trench electrode is longer than a total length, per unit area of the IGBT element region, of a borderline configuring the opening portion of the first trench electrode.

5. A method for fabricating a semiconductor device that comprises an IGBT element region and a diode element region in one semiconductor substrate, the method comprising:
   a first forming process of forming a first trench electrode in the IGBT element region;
   a second forming process of forming a second trench electrode in the diode element region;
   a contacting process of causing a wafer make contact with a wafer holding table including heavy metal; and
   a heating process of heating the wafer after the contacting process,
   wherein when the surface of the wafer to which the first forming process and the second forming process have been performed is observed, a total length, per unit area of the diode element region, of a borderline configuring an opening portion of the second trench electrode is longer than a total length, per unit area of the IGBT element region, of a borderline configuring an opening portion of the first trench electrode, and the first forming process and the second forming process are performed prior to the heating process.

6. The method according to claim 5, further comprising:

a polishing process of polishing a back surface of the wafer, wherein the polishing process is performed prior to the contacting process.

\* \* \* \* \*